United States Patent
Wakabayashi et al.

(10) Patent No.: US 6,931,341 B2
(45) Date of Patent: Aug. 16, 2005

(54) AUTOMATIC ADJUSTING METHOD FOR MEASURING EQUIPMENT AND APPARATUS USING THE SAME

(75) Inventors: Tomoharu Wakabayashi, Tokyo (JP); Masaharu Ohya, Tokyo (JP); Kazuyoshi Kobayashi, Tokyo (JP); Hiroaki Takinami, Tokyo (JP); Nobuhiko Takeda, Tokyo (JP)

(73) Assignee: Rion Co., Ltd., Tokyo (JP)

( * ) Notice: Subject to any disclaimer, the term of this patent is extended or adjusted under 35 U.S.C. 154(b) by 129 days.

(21) Appl. No.: 10/450,179

(22) PCT Filed: May 21, 2002

(86) PCT No.: PCT/JP02/04912
§ 371 (c)(1),
(2), (4) Date: Jun. 3, 2003

(87) PCT Pub. No.: WO03/023328
PCT Pub. Date: Mar. 20, 2003

(65) Prior Publication Data
US 2004/0141417 A1 Jul. 22, 2004

(30) Foreign Application Priority Data
Sep. 10, 2001 (JP) ........................................ 2001-273635

(51) Int. Cl.⁷ .......................... G01C 19/00; G01D 3/00; G01R 29/26
(52) U.S. Cl. ........................ 702/104; 702/111; 324/613
(58) Field of Search ........................... 702/104, 57, 66, 702/111; 324/601, 602, 613, 614

(56) References Cited

FOREIGN PATENT DOCUMENTS

| JP | 59-28797 | | 2/1984 | |
| JP | 04-058615 | | 2/1992 | |
| JP | 05-034145 | | 2/1993 | |
| JP | 05334578 A | * | 12/1993 | ........... G08B/17/00 |
| WO | PCT/JP02/04912 | | 5/2002 | |

* cited by examiner

Primary Examiner—Bryan Bui
Assistant Examiner—Meagan S Walling
(74) Attorney, Agent, or Firm—Carrier, Blackman & Associates, P.C.; Joseph P. Carrier; William D. Blackman

(57) ABSTRACT

An apparatus that automatically adjusts self-noise and can lower the lower limit value of a measurement range by reducing the effects of self-noise on measured values. This apparatus corrects self-noise when amplifying an output signal from a sensor so as to conform to a sensor sensitivity G, further processing the amplified signal, and then outputting the processed signal as a measured value. This apparatus includes a sensor sensitivity adjusting circuit that adjusts an amplification factor so as to conform to the sensor sensitivity G, a self-noise value calculating circuit 4 that calculates a self-noise component F·N from the amplification factor adjusted by the sensor sensitivity adjusting circuit so as to conform to the sensor sensitivity G, and a measured value correcting circuit that calculates a true measured value F·S from the self-noise component F·N calculated by the self-noise value calculating circuit 4 as well as a measured value L containing the self-noise component F·N.

16 Claims, 23 Drawing Sheets

US 6,931,341 B2

1

AUTOMATIC ADJUSTING METHOD FOR MEASURING EQUIPMENT AND APPARATUS USING THE SAME

TECHNICAL FIELD

The present invention relates to a method of automatically regulating self-noise or the like which method is applied to measuring equipment such as an audio measuring instrument or a vibration measuring instrument which is provided with a sensor, as well as an apparatus using this method.

BACKGROUND ART

Conventional measuring equipment is known which is configured as shown in FIG. 20. That is, in this equipment, a signal S to be measured is inputted to a sensor 100, and an amplifier 101 then amplifies an output signal from the sensor 100 to a predetermined level. Furthermore, a sensor sensitivity adjusting circuit 102 amplifies an output signal from the amplifier 101 to a desired level compatible with the sensitivity of the sensor 100. Then, a processing section 103 executes processes such as an effective value operation and A/D conversion on an output signal from the sensor sensitivity adjusting circuit 102. Finally, a display 104 displays an output signal from the processing section 103 as a measured value L.

Further, a signal processing circuit used in the conventional measuring equipment is configured as shown in FIG. 21. That is, in this circuit, in order to deal with inputted analog signals with a wide range of amplitudes, an amplifying circuit 200 and an attenuating circuit 201 are connected together in parallel to simultaneously process the analog signals. When the analog signal has a small amplitude, a signal amplified by the amplifying circuit 200 is mainly employed. On the other hand, when the analog signal has a large amplitude, a signal attenuated by the attenuating circuit 201 is employed. These signals are subjected to A/D conversion by A/D converters 202 and 203, and then the converted signals are synthesized with each other by a processor 204 provided with a synthesizing circuit. Reference numeral 205 denotes an amplification factor adjuster, and reference numeral 206 denotes a microphone. Reference numeral 207 denotes an input amplifier, and reference numeral 208 denotes a display.

Further, a calibration operation for the signal processing circuit of the measuring equipment is essential in determining criteria for output signals from a sensor or the like. A calibration circuit generally has a sensor sensitivity adjusting circuit that absolutely calibrates the sensitivity of the sensor and an internal calibration circuit that subjects the results of the absolute calibration to self-diagnosis to check whether or not the measuring equipment has been calibrated.

Furthermore, the measuring equipment provided with the calibration circuit comprises, for example as shown in FIG. 22, a microphone 300, an input switch 301, an amplifier 302, a sensor sensitivity adjusting circuit 303 composed of a variable resistor, an A/D converter 304, a processing section 305 having an effective-value calculating circuit, a display 306, an internal-calibration signal oscillator 307, an internal-calibration signal adjusting circuit 308 composed of a variable resistor, and other components.

First, absolute calibration is carried out as described below. An analog signal from the microphone 300 is inputted. The inputted analog signal is inputted to the sensor sensitivity adjusting circuit 303 via the input switch 301 and the amplifier 302. Then, the sensor sensitivity adjusting

2 circuit 303 adjusts the amplitude of the analog signal to a predetermined value and then inputs the adjusted signal to the processing section 305 via the A/D converter 304. Then, the display 306 displays the result of calculation executed by the effective-value calculating circuit possessed by the processing section 305. At this time, when a predetermined value is displayed as the result, the absolute calibration is completed.

Then, internal calibration is carried out as described below. The internal-calibration signal oscillator 307 outputs an internal-calibration signal. This internal-calibration signal is inputted to the processing section 305 via the internal-calibration signal adjusting circuit 308, the input switch 301, the amplifier 302, the sensor sensitivity adjusting circuit 303, and the A/D converter 304. Then, the effective-value calculating circuit of the processing section 305 calculates an effective value. This effective value is displayed on the display 306. The internal-calibration signal adjusting circuit 308 then adjusts this displayed value to a predetermined value, thus completing the internal calibration.

This calibration method is easily carried out by adjusting variable resistance.

Furthermore, in a conventional acoustic measuring instrument, an input signal loaded through an A/D converter is processed by a DSP (Digital System Processor), and the processed signal is outputted through a D/A converter. However, since a voltage proportional to the input signal is outputted from an output terminal while absorbing differences in the characteristics of components such as resistors and D/A converters, an electric circuit 400 such as the one shown in FIG. 23 is generally inserted between a D/A converter 401 and an output terminal 402.

Inserting the electric circuit 400 allows an input signal x and an output terminal voltage y to have a proportional relationship as shown in FIG. 24. In this case, $y=ax+b$ represents an I/O relationship in an actual circuit, and $y=a_0x+b_0$ represents a desired I/O relationship.

If the desired I/O relationship is established by adjusting a variable resistance VR1 in the electric circuit 400 so as to make the inclination a of the straight line closer to the desired value $a_0$ and adjusting a variable resistance VR2 so as to make the intercept b of the straight line y closer to the desired value $b_0$.

However, a change in variable resistance VR1 actually changes the intercept b.

Accordingly, during an actual operation, to adjust the inclination a so as to make it closer to the desired value $a_0$, it is necessary to input two types of reference signals R1 and R2 the magnitudes of which are different and then to determine the inclination from the difference between outputs (M1–M2).

Thus, in the prior art, the inclination a of the straight line is adjusted to the desired value $a_0$ while repeatedly and alternately inputting the two types of reference signals R1 and R2 and fine-tuning the two variable resistances VR1 and VR2.

Further, an acoustic measuring instrument is normally provided with a level range switch used to select an optimum maximum input level according to the level of an input signal to be measured.

However, an error is sure to occur in amplification factor for each range of the level range switch owing to differences among resistors constituting amplifiers provided for the respective ranges. Such errors can be adjusted to within a desired error range by managing the resistance values of the resistors constituting the amplifiers.

Thus, adjusting resistors may be provided in order to reduce errors in amplification factor caused by the level range switch.

Similarly, the acoustic measuring instrument is provided with a frequency characteristic switch used to select a correction circuit that corrects the frequency characteristic of an input signal to be measured.

However, an error is sure to occur in amplification factor for each range of the frequency characteristic switch owing to differences among resistors constituting correction circuits provided for the respective ranges. Such errors can be adjusted to within a desired error range by managing the resistance values of the resistors constituting the amplifiers.

Thus, adjusting resistors may be provided in order to reduce errors in amplification factor caused by the frequency characteristic switch.

However, in the conventional measuring equipment shown in FIG. 20, no consideration is given to the effects on measured values of self-noise N from the sensor 100, amplifier 101, sensor sensitivity adjusting circuit 102, or the like. Accordingly, if an input signal S to the sensor 100 which is to be measured is small in magnitude, the self-noise N produces marked effects. This makes measurements impossible, resulting in deviation from the measurement range.

That is, as shown in FIG. 3, with the conventional measuring equipment, the relationship between the input signal S to the sensor 100 and a measured value L displayed on the display 104 remains linear if the input signal S exceeds a certain level Se. However, if the input signal S has the level Se or lower, the self-noise N contributes to eliminating the linearity. Consequently, input signals S at the level Se or lower are beyond the measurement range and cannot be measured.

In the figure, if the input signal S has the level Se or lower, the solid line indicates an actual measured value, whereas the dotted line indicates an ideal measured value.

Further, in the signal processing circuit shown in FIG. 21, input analog signals are amplified by the amplifying circuit 200 and attenuated by the attenuating circuit 201. These signals are then subjected to A/D conversion to obtain digital signals. The synthesizing circuit then converts and synthesizes the signals according to the amplification factor of the amplifying circuit 200 and the attenuation factor of the attenuating circuit 201. It is thus necessary to adjust the ratio of the amplification factor of the amplification circuit 200 to the attenuation factor of the attenuating circuit 201 to a predetermined value.

Thus, during an actual adjusting operation, while checking the displayed value shown on the display 208, the variable resistances constituting the amplification factor adjuster 205 must be adjusted to make the displayed value closer to a specified value. Consequently, the operation is not efficient.

Further, with the measuring equipment shown in FIG. 22, during an actual calibration operation, while checking the displayed value shown on the display 306 of the measuring equipment, the variable resistances must be adjusted to make the displayed value closer to a specified value. Consequently, the operation is not efficient.

Furthermore, if variable resistors are used, which are important elements that determine the performance of the measuring equipment, then the adjusted value may be varied by an external factor such as vibration. Thus, the use of variable resistors may result in instability.

Moreover, if the electric circuit 400 such as the one shown in FIG. 23 is inserted between the D/A converter 401 and the output terminal 402, an operator must regulate each acoustic measuring instrument and fine-tune the two variable resistances VR1 and VR2 many times. As a result, a large number of adjustment steps are required.

Further, if the acoustic measuring instrument is provided with a level range switch used to select the optimum maximum input level according to the level of an input signal to be measured, then errors in amplification factor caused by the level range switch and a frequency characteristic switch are not fully adjusted. It has thus been desirable to substantially zero switching errors associated with such range switching.

The present invention is provided in view of these problems of the conventional technique. It is thus an object of the present invention to provide a method of automatically correcting self-noise which method can lower the lower limit value of a measurement range by reducing the effects of self-noise on measured values, as well as an apparatus using this method.

DISCLOSURE OF THE INVENTION

To accomplish the above object, a first aspect of the present invention provides a method of correcting self-noise when amplifying an output signal from a sensor so as to conform to the sensitivity of the sensor, further processing the amplified signal, and then outputting the processed signal as a measured value, the method comprising calculating a self-noise component from the sensor sensitivity, using this self-noise component as an element to calculate a correction value, and using this correction value to reduce the effects of the self-noise on the measured value.

A second aspect of the present invention provides an apparatus which corrects self-noise when amplifying an output signal from a sensor so as to conform to the sensitivity of the sensor, further processing the amplified signal, and then outputting the processed signal as a measured value, the apparatus comprising sensor sensitivity adjusting means for adjusting an amplification factor so as to conform to the sensor sensitivity, self-noise value calculating means for calculating a self-noise component from the amplification factor adjusted by the sensor sensitivity adjusting means so as to conform to the sensor sensitivity, and measured value correcting means for calculating a true measured value on the basis of the self-noise component calculated by the self-noise value calculating means as well as the measured value containing the self-noise component.

A third aspect of the present invention provides a method of adjusting an amplification factor of a signal processing circuit in which analog signals are simultaneously inputted to an amplifying circuit and an attenuating circuit and in which the amplified signal and the attenuated signal are then subjected to A/D conversion and synthesized with each other, the method comprising, after generating a digital signal as a reference signal and subjecting this digital signal to D/A conversion, using the amplifying circuit to amplify the converted signal, subjecting the amplified signal to A/D conversion, then executing an arithmetic process on the converted signal to calculate a value, using the attenuating circuit to attenuate the signal, subjecting the attenuated signal to A/D conversion, then executing an arithmetic process on the converted signal to calculate a value, calculating an amplitude ratio of these values, comparing this amplitude ratio with an amplification ratio of the amplifying circuit to the attenuating circuit, calculating an adjustment amplification factor for the signal synthesis of the analog signal inputted to the amplifying circuit or the attenuating circuit, storing this adjustment amplification factor, and for actual signal processing, multiplying the amplification factor of the amplifying circuit or the attenuation factor of the attenuating circuit by the adjustment amplification factor.

A fourth aspect of the present invention provides an apparatus which adjusts an amplification factor of a signal processing circuit in which analog signals are simultaneously inputted to an amplifying circuit and an attenuating circuit and in which the amplified signal and the attenuated signal are then subjected to A/D conversion and synthesized with each other, the apparatus comprising signal generating means for generating a digital signal as a reference signal, a D/A converter which subjects the digital signal generated by the signal generating means to D/A conversion, an amplifying circuit which amplifies an output signal from the D/A converter, an attenuating circuit which attenuates the output signal from the D/A converter, a first A/D converter which subjects an output signal from the amplifying circuit to A/D conversion, a second A/D converter which subjects an output signal from the attenuating circuit to A/D conversion, arithmetic means for executing an arithmetic process on the output signals from the first A/D converter and second A/D converter, comparison means for calculating an amplitude ratio of a value based on the output signal from the first A/D converter to a value based on the output signal from the second A/D converter, the values being calculated by the arithmetic means, to compare this amplitude ratio with an amplification ratio of the amplifying circuit to the attenuating circuit, amplification factor correcting means for calculating an adjustment amplification factor for the signal synthesis of the analog signal inputted to the amplifying circuit or attenuating circuit on the basis of a result of the comparison carried out by the comparison means, and memory means for storing the adjustment amplification factor calculated by the amplification factor correcting means, wherein for actual signal processing, the amplification factor of the amplifying circuit or the attenuation factor of the attenuating circuit is multiplied by the adjustment amplification factor.

A fifth aspect of the present invention provides a method of adjusting an amplification factor of a signal processing circuit in which analog signals are simultaneously inputted to an amplifying circuit and an attenuating circuit and in which the amplified signal and the attenuated signal are then subjected to A/D conversion and synthesized with each other, the method comprising generating a first digital signal as a first reference signal, subjecting this first digital signal to D/A conversion, using the amplifying circuit to amplify the converted signal, subjecting the amplified signal to A/D conversion, then executing an arithmetic process on the converted signal to calculate a value, generating a second digital signal as a second reference signal, subjecting this second digital signal to D/A conversion, using the attenuating circuit to attenuate the converted signal, subjecting the attenuated signal to A/D conversion, then executing an arithmetic process on the converted signal to calculate a value, comparing an amplitude ratio of these values obtained with an amplification ratio of the amplifying circuit to the attenuating circuit, calculating an adjustment amplification factor for the signal synthesis of the analog signal inputted to the amplifying circuit or the attenuating circuit, storing this adjustment amplification factor, and for actual signal processing, multiplying the amplification factor of the amplifying circuit or the attenuation factor of the attenuating circuit by the adjustment amplification factor.

A sixth aspect of the present invention provides an apparatus which adjusts an amplification factor of a signal processing circuit in which analog signals are simultaneously inputted to an amplifying circuit and an attenuating circuit and in which the amplified signal and the attenuated signal are then subjected to A/D conversion and synthesized with each other, the apparatus comprising signal generating means for generating a first and second digital signals as two types of reference signals, a D/A converter which subjects the first and second digital signals generated by the signal generating means to D/A conversion, an amplifying circuit which amplifies the first digital signal outputted by the D/A converter, an attenuating circuit which attenuates the second digital signal outputted by the D/A converter, a first A/D converter which subjects an output signal from the amplifying circuit to A/D conversion, a second A/D converter which subjects an output signal from the attenuating circuit to A/D conversion, arithmetic means for executing an arithmetic process on the output signals from the first A/D converter and second A/D converter, comparison means for calculating an amplitude ratio of a value based on the first digital signal to a value based on the second digital signal, the values being calculated by the arithmetic means, to compare this amplitude ratio with an amplification ratio of the amplifying circuit to the attenuating circuit, amplification factor correcting means for calculating an adjustment amplification factor for the signal synthesis of the analog signal inputted to the amplifying circuit or attenuating circuit on the basis of a result of the comparison carried out by the comparison means, and memory means for storing the adjustment amplification factor calculated by the amplification factor correcting means, wherein for actual signal processing, the amplification factor of the amplifying circuit or the attenuation factor of the attenuating circuit is multiplied by the adjustment amplification factor.

A seventh aspect of the present invention provides a method of automatically adjusting an internal calibration signal which method adjusts a calibration signal contained in measuring equipment, the method comprising generating a digital signal as an internal calibration signal, subjecting this digital signal to D/A conversion, amplifying the converted signal, subjecting the amplified signal to A/D conversion, executing an arithmetic process on the converted signal to calculate an effective value, comparing the effective value with a predetermined calibration value to calculate an adjustment factor for the internal calibration signal, storing this adjustment factor, and for self-diagnosis for determining whether or not calibration has been actually completed, using a signal obtained by multiplying the above digital signal by the adjustment factor.

An eighth aspect of the present invention provides an automatic adjusting apparatus for an internal calibration signal which apparatus adjusts a calibration signal contained in measuring equipment, the apparatus comprising digital signal generating means for generating a digital signal as an internal calibration signal, a D/A converter which subjects the digital signal generated by the digital signal generating means to D/A conversion, effective-value calculating means for amplifying an output signal from the D/A converter, subjecting the amplified signal to A/D conversion, and then executing an arithmetic process on the converted signal, signal comparing means for comparing an effective value calculated by the effective-value calculating means, with a predetermined calibration value, factor calculating means for calculating an adjustment factor for the internal calibration signal on the basis of a result of the comparison carried out by the signal comparing means, and memory means for storing the adjustment factor calculated by the factor calculating means, wherein a signal obtained by multiplying the above digital signal by the adjustment factor is used for self-diagnosis for determining whether or not calibration has been actually completed.

A ninth aspect of the present invention provides an output voltage value adjusting method of executing signal processing on an input signal, subjecting the processed signal to D/A conversion, amplifying the converted signal, and outputting from an output terminal a voltage that is in a desired proportional relationship with the input signal, the method comprising calculating a correction factor using a reference voltage, an output terminal voltage for the reference voltage, and a desired output terminal voltage for the reference voltage, storing the correction factor, and for actual measurement, multiplying the above input signal by the correction factor to calculate a correction value, subjecting this correction value to D/A conversion, amplifying the converted signal, and outputting the amplified signal to an output terminal.

A tenth aspect of the present invention provides an output voltage value adjusting apparatus which executes signal processing on an input signal, processing the resulting signal through a D/A converter and an amplifier to obtain a voltage that is in a desired proportional relationship with the input signal, and then outputting this voltage from an output terminal, the apparatus comprising reference voltage generating means for generating a reference voltage, an A/D converter which subjects to A/D conversion an output terminal voltage obtained from the reference voltage generated by the reference voltage generating means, adjustment value calculating means for calculating a correction factor using an output signal from the A/D converter, a desired output terminal voltage for the reference voltage, and the reference voltage, memory means for storing the correction factor calculated by the adjustment value calculating means, and signal processing means for reading the correction factor from the memory means and calculating a correction value from the input signal and the correction factor, wherein the correction value is outputted to the output terminal through the D/A converter and the amplifier.

According to an eleventh aspect of the present invention, the automatic adjusting method for measuring equipment according to the ninth aspect is applied to an acoustic measuring instrument such as a sound level meter, a vibrometer, or a frequency analyzer.

According to a twelfth aspect of the present invention, the automatic adjusting apparatus for measuring equipment according to the tenth aspect is applied to an acoustic measuring instrument such as a sound level meter, a vibrometer, or a frequency analyzer.

A thirteenth aspect of the present invention provides a method of automatically correcting an error in amplification factor for each range of a range switch for a measuring instrument, the method comprising using a reference signal to calculate a correction amount from the error in amplification factor for each range of the range switch, storing the correction amount in a memory, reading from the memory a correction amount corresponding to a range of the range switch selected for actual measurement, and adding the correction amount to a measured value to obtain a final measured value.

A fourteenth aspect of the present invention provides an apparatus which automatically corrects an error in amplification factor for each range of a range switch for a measuring instrument, the apparatus comprising reference signal oscillating means for generating a reference signal, correction amount calculating means for using the reference signal generated by the reference signal oscillating means to calculate a correction amount from the error in amplification factor for each range of the range switch, memory means for storing the correction amounts calculated by the correction amount calculating means so that the correction amounts correspond to the respective ranges, and correction processing means for reading from the memory means a correction amount corresponding to a range of the range switch selected for actual measurement and adding the correction amount to a measured value.

According to a fifteenth aspect of the present invention, in the automatic adjusting method for measuring equipment according to the thirteenth aspect, the range switch is a level range switch and/or frequency characteristic switch provided in an acoustic measuring instrument such as a sound level meter, a vibrometer, or a frequency analyzer.

According to a sixteenth aspect of the present invention, in the automatic adjusting apparatus for measuring equipment according to the fourteenth aspect, the range switch is a level range switch and/or frequency characteristic switch provided in an acoustic measuring instrument such as a sound level meter, a vibrometer, or a frequency analyzer.

BEST MODE FOR CARRYING OUT THE INVENTION

Figure 1:
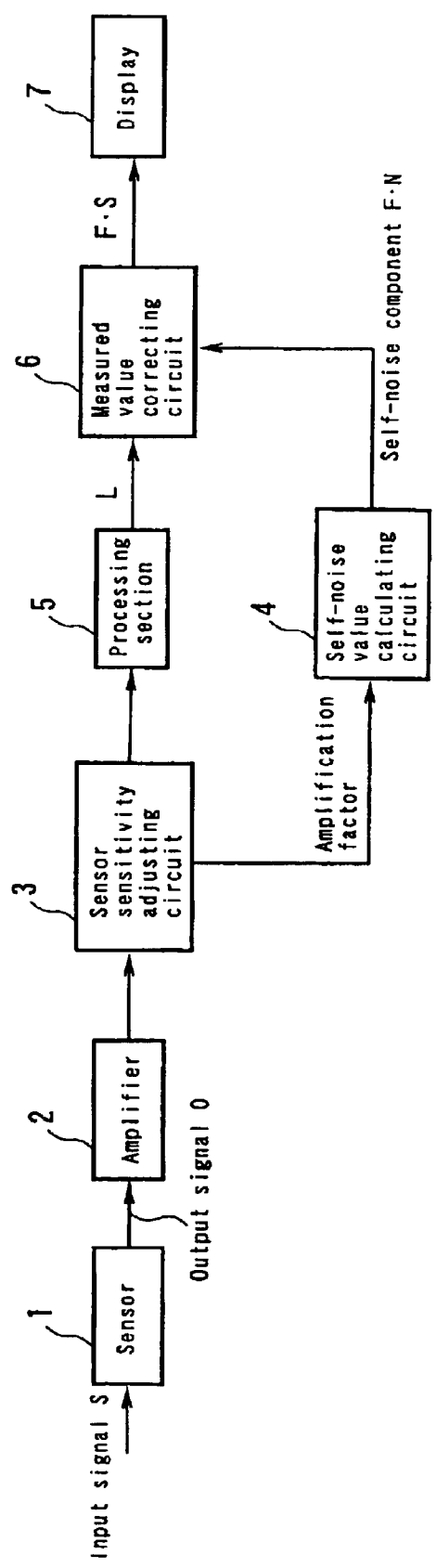
FIG. 1 is a block diagram of measuring equipment provided with an automatic adjusting apparatus according to a first embodiment of the present invention.
Figure 2:
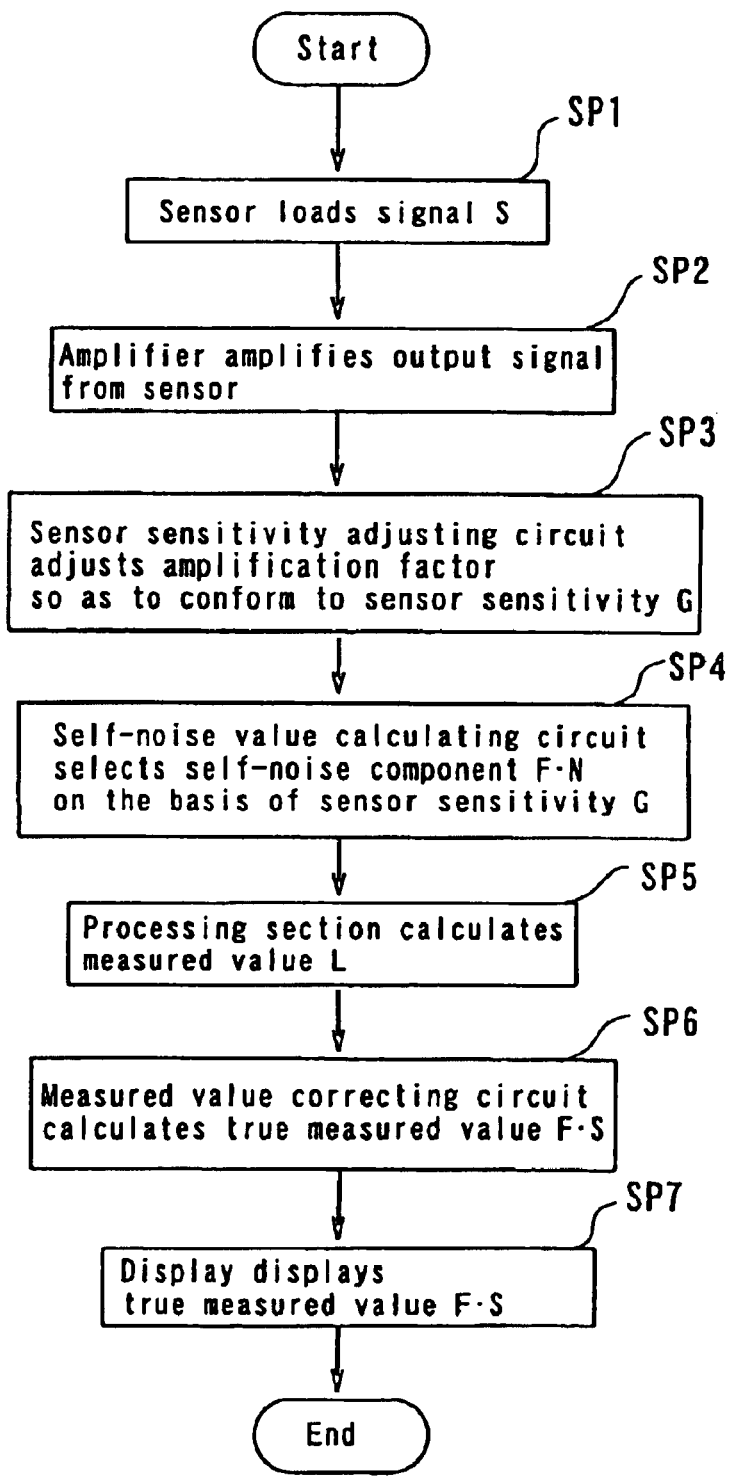
FIG. 2 is a flow chart showing a procedure of a method of correcting self-noise.
Figure 3:
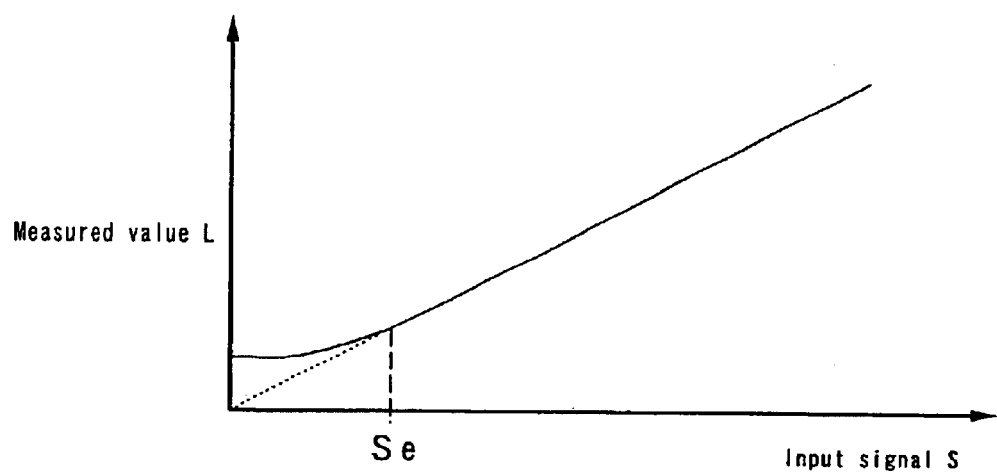
FIG. 3 is a graph showing the relationship between an input signal S to a sensor and a measured value L displayed on a display.

Embodiments of the present invention will be described below with reference to the accompanying drawings. FIG. 1 is a block diagram of measuring equipment provided with an apparatus that corrects self-noise according to the present invention. FIG. 2 is a flow chart showing a procedure of a method of correcting self-noise according to the present invention. FIG. 3 is a graph showing the relationship between an input signal S to a sensor and a measured value L displayed on a display.

The measuring equipment provided with the automatic adjusting apparatus according to a first embodiment of the present invention comprises a sensor 1, an amplifier 2, a sensor sensitivity adjusting circuit 3, a self-noise value calculating circuit 4, a processing section 5, a measured value correcting circuit 6, and a display 7 as shown in FIG. 1.

A signal S inputted to the sensor 1 is subjected to an arithmetic process through the amplifier 2, the sensor sensitivity adjusting circuit 3, and the processing section 5. A measured value L as an output signal from the processing section 5 can be expressed as Equation (1).

$$L = F \cdot (S^2 + N^2)^{1/2} \quad (1)$$

In this equation, reference character N denotes self-noise composed of self-noise $N_M$ from the sensor 1 and self-noise $N_A$ from the amplifier 2 and sensor sensitivity adjusting circuit 3. Reference character F denotes a factor for processing such as leveling or weighting which is executed to convert the input signal S into the measured value L while the input signal S is being processed by the sensor 1, the amplifier 2, the sensor sensitivity adjusting circuit 3, and the processing section 5. The self-noise N can be expressed as Equation (2).

$$N = (N_M^2 + N_A^2)^{1/2} \quad (2)$$

Accordingly, a true measured value F·S corresponding to the input signal S to the sensor 1 can be expressed as Equation (3).

$$F \cdot S = (L^2 - F^2 \cdot N^2)^{1/2} \quad (3)$$

Consequently, as shown in Equation (3), even if the input signal S is small in magnitude, the linearity between the input signal S and the measured value L can be maintained by subtracting a self-noise component F·N from the measured value L, the self-noise component F·N impairing the linearity between the input signal S and the measured value L. The self-noise $N_M$ is mainly determined by the sensitivity G of the sensor 1. The self-noise $N_A$ is determined by the amplification factor of the entire measuring equipment determined by the sensitivity G of the sensor 1. Therefore, the self-noise component F·N becomes known through a sensitivity adjusting operation.

The sensor 1 corresponds to an electroacoustic converter such as a microphone, a mechanoelectric converter such as a vibration pickup, or another converter that receives a certain input signal S to convert it into an electric signal. The amplifier 2 amplifies an output signal O from the sensor 1 to a certain level.

The sensor sensitivity adjusting circuit 3 adjusts the amplification factor so as to conform to the sensor sensitivity G and amplifies an output signal from the amplifier 2 so that the ratio of the output signal O from the sensor 1 to the output signal (measured value L) from the sensor sensitivity adjusting circuit 3 has a desired value. Accordingly, the amplification factor of the sensor sensitivity adjusting circuit 3 is determined by the input signal S to the sensor 1, the sensor sensitivity G (the ratio of the input signal S to the sensor 1 to the output signal O from it), the amplification factor of the amplifier 2, and the measured value L.

The sensor sensitivity adjusting means is composed of the amplifier 2 and the sensor sensitivity adjusting circuit 3.

On the basis of value of the sensor sensitivity G, the self-noise value calculating circuit 4 selects the self-noise component F·N with reference to a table indicating the relationship between the sensor sensitivity G and the self-noise component F·N. The self-noise value calculating circuit 4 already stores the table indicating the relationship between the sensor sensitivity G and the self-noise component F·N. An output signal from the self-noise value calculating circuit 4 constitutes the self-noise component F·N. Further, the self-noise value calculating circuit 4 can calculate the self-noise component F·N using an already derived relation.

The processing section 5 executes an arithmetic process on the output signal from the sensor sensitivity adjusting circuit 3 to calculate an effective value. The processing section 5 then subjects this effective value to A/D conversion. An output signal from the processing section 5 is the measured value L.

The measured value correcting circuit 6 executes an arithmetic process on the measured value L, the output signal from the processing section 5, and the self-noise component F·N, the output signal from the self-noise value calculating circuit 4 to calculate the true measured value F·S. Further, on the basis of the measured value L, the measured value correcting circuit 6 can select the true measured value F·S with reference to the table indicating the relationship between the measured value L and the self-noise component F·N and without relying on any calculations.

The display 7 displays the output signal (true measured value F·S) from the measured value correcting circuit 6.

With reference to the flow chart shown in FIG. 2, description will be given of operation of the measuring equipment provided with the automatic adjusting apparatus according to the first embodiment of the present invention configured as described above, i.e. a method of correcting self-noise.

First, at step SP1, the sensor 1 loads a signal S for vibration or noise, converts it into an electric signal, and then outputs this signal.

At step SP2, the amplifier 2 amplifies the output signal O from the sensor 1 to a certain level.

At step SP3, the sensor sensitivity adjusting circuit 3 adjusts the amplification factor so as to conform to the sensor sensitivity G. The sensor sensitivity adjusting circuit 3 further amplifies an output signal from the amplifier 2 so that the output signal (measured value L) from the sensor sensitivity adjusting circuit 3 has a desired level.

At step SP4, the self-noise value calculating circuit 4 selects and outputs the self-noise component F·N corresponding to the sensor sensitivity G from the table indicating the relationship between the sensor sensitivity G and the self-noise component F·N.

At step SP5, the processing section 5 executes an arithmetic process on the output signal from the sensor sensitivity adjusting circuit 3 to calculate an effective value. The processing section 5 further subjects this effective value to A/D conversion to output the measured value L.

At step SP6, the measured value correcting circuit 6 executes an arithmetic process on the measured value L, the output signal from the processing section 5, and the self-noise component F·N, the output signal from the self-noise value calculating circuit 4 ($(L^2-F^2 \cdot N^2)^{1/2}$) to calculate the true measured value F·S.

At step SP7, the display 7 displays an output signal (true measured value F·S) from the measured value correcting circuit 6.

Accordingly, as shown in FIG. 3, even if the input signal S is at a level Se or lower, it is allowed to fall within the measurement range. This is because its linearity can be maintained by eliminating the effects of self-noise N from it.

Figure 4:
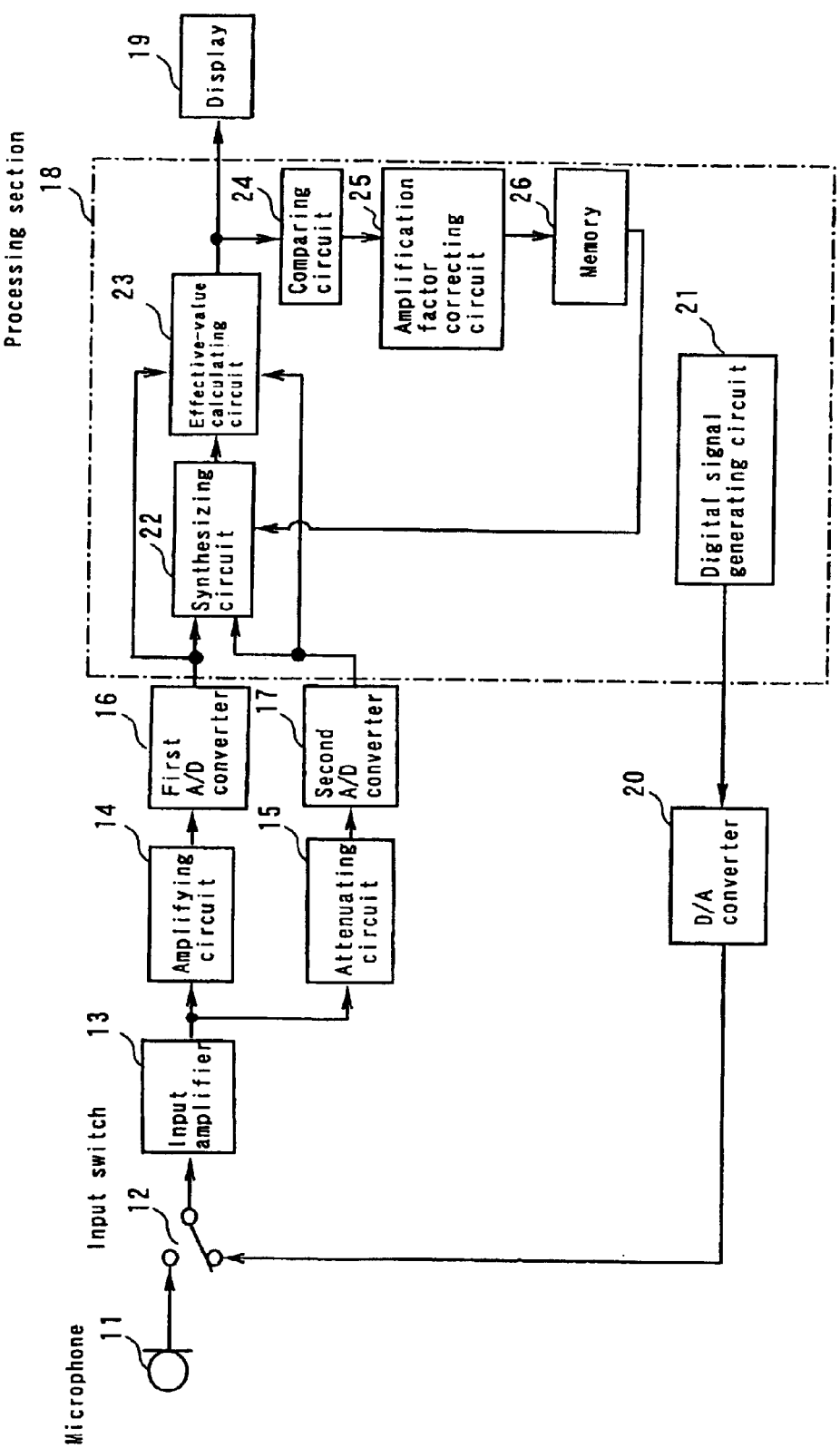
FIG. 4 is a block diagram of measuring equipment provided with an automatic adjusting apparatus according to a second embodiment of the present invention.

Next, measuring equipment provided with an automatic adjusting apparatus according to a second embodiment of the present invention comprises a microphone 11, an input switch 12, an input amplifier 13, an amplifying circuit 14 with an amplification factor a, an attenuating circuit 15 with an attenuation factor b, a first A/D converter 16, a second A/D converter 17, a processing section 18, a display 19, and a D/A converter 20 as shown in FIG. 4.

The processing section 18 is composed of a digital signal generating circuit 21 that generates a plurality of digital signals as reference signals, a synthesizing circuit 22 that synthesizes output signals from the first A/D converter 16 and second A/D converter 17 with each other, an effective-value calculating circuit 23 that executes an arithmetic process on an output signal from the synthesizing circuit 22 to calculate an effective value, a comparing circuit 24 that calculates the amplitude ratio of a value based on the output signal from the first A/D converter 16 to a value based on the output signal from the second A/D converter 17, the values being calculated by the effective-value calculating circuit 23, to compare this amplitude ratio with the amplification ratio (a/b) of the amplifying circuit 14 to the attenuating circuit 15, an amplification factor correcting circuit 25 that calculates, on the basis of result of the comparison by the comparing circuit 24, adjustment amplification factors α and β for the signal synthesis of an analog signal inputted to the amplifying circuit 14 or attenuating circuit 15, and a memory 26 that stores the adjustment amplification factors α and β calculated by the amplification factor correcting circuit 25.

Here, reference signals generated by the digital signal generating circuit 21 are referred to as a "first digital signal R1", a "second digital signal R2", and a "third digital signal R3", respectively.

Further, an effective value M1 is defined to be calculated by the effective-value calculating circuit 23 on the basis of the first digital signal R1, which has been processed by the D/A converter 20, the input switch 12, the input amplifier 13, the amplifying circuit 14, and the first A/D converter 16. An effective value M2 is defined to be calculated by the effective-value calculating circuit 23 on the basis of the first digital signal R1, which has been processed by the D/A converter 20, the input switch 12, the input amplifier 13, the attenuating circuit 15, and the second A/D converter 17.

Furthermore, an effective value M3 is defined to be calculated by the effective-value calculating circuit 23 on the basis of the second digital signal R2, which has been processed by the D/A converter 20, the input switch 12, the input amplifier 13, the amplifying circuit 14, and the first A/D converter 16. An effective value M4 is defined to be calculated by the effective-value calculating circuit 23 on the basis of the third digital signal R3, which has been processed by the D/A converter 20, the input switch 12, the input amplifier 13, the attenuating circuit 15, and the second A/D converter 17.

The amplitude of the first digital signal R1 is defined as R1. The amplitude of the second digital signal R2 is defined as R2. The amplitude of the third digital signal R3 is defined as R3. The amplitude of the effective value M1 is defined as M1. The amplitude of the effective value M2 is defined as M2. The amplitude of the effective value M3 is defined as M3. The amplitude of the effective value M4 is defined as M4.

With reference to the flow chart shown in FIGS. 5 and 6, description will be given of operation of the automatic adjusting apparatus according to the second embodiment of the present invention configured as described above, i.e. a method of adjusting the amplification factor of the signal processing circuit.

Figure 5:
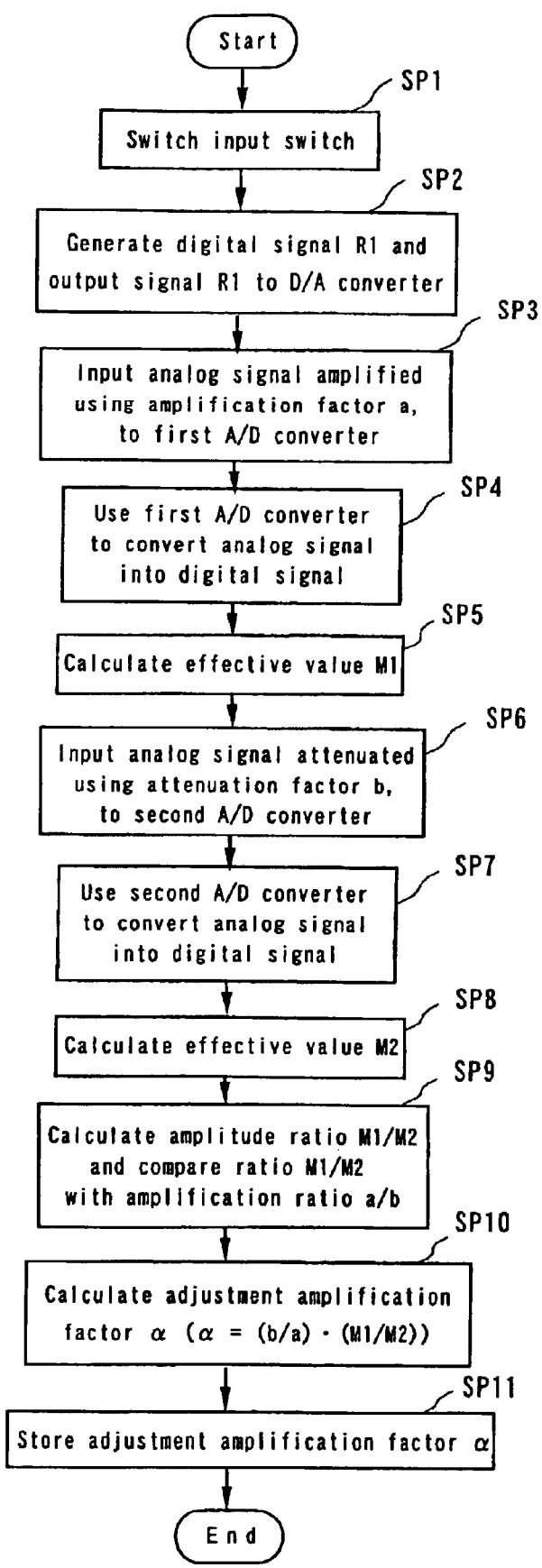
FIG. 5 is a flow chart of an operational procedure executed if an amplification factor adjusting device of a signal processing circuit is used.

FIG. 5 shows an operation of obtaining the adjustment amplification factor α. First, at step SP1, the input switch 12 is switched so as to constitute a circuit for an operation of adjusting the amplification factor.

At step SP2, the digital signal generating circuit 21 generates the first digital signal R1 of a predetermined amplitude as a reference signal. It then outputs this signal to the D/A converter 20.

At step SP3, the reference signal converted into an analog signal by the D/A converter 20 is transmitted through the input switch 12 and the input amplifier 13 to the amplifying circuit 14, where it is amplified using the amplification factor a and is then inputted to the first A/D converter 16.

Then, at step SP4, the analog signal amplified using the amplification factor a is converted into a digital signal by the first A/D converter 16. Furthermore, at step SP5, the effective-value calculating circuit 23 executes an arithmetic process on the digital signal provided by the first A/D converter 16 to calculate the effective value Further, at step SP6, the reference signal converted into an analog signal by M1. the D/A converter 20 is transmitted through the input switch 12 and the input amplifier 13 to the attenuating circuit 15, where it is attenuated using the attenuation factor b and is then inputted to the second A/D converter 17.

Then, at step SP7, the analog signal attenuated using the attenuation factor b is converted into a digital signal by the second A/D converter 17. Furthermore, at step SP8, the effective-value calculating circuit 23 executes an arithmetic process on the digital signal provided by the second A/D converter 17 to calculate the effective value M2.

At step SP9, the comparing circuit 24 calculates the amplitude ratio (M1/M2) of the effective value M1 based on an output signal from the first A/D converter 16 and the effective value M2 based on an output signal from the second A/D converter 17, the effective values being calculated by the effective-value calculating circuit 23, and compares this amplitude ratio with the amplification ratio (a/b) of the amplifying circuit 14 to the attenuating circuit 15. In this regard, the effective value is not necessarily used if the comparing circuit 24 calculates the amplitude ratio of the output signal from the first A/D converter 16 to the output signal from the second A/D converter 17.

At step SP10, on the basis of result of the comparison carried out by the comparing circuit 24, the amplification factor correcting circuit 25 calculates the adjustment amplification factor a for the signal synthesis of the analog signal inputted to the amplifying circuit 14 (=(b/a)·(M1/M2)). An adjustment amplification factor $\alpha'(=1/\alpha)$, the inverse of the adjustment amplification factor $\alpha$, can be used for the signal synthesis of the analog signal inputted to the attenuating circuit 15.

At step SP11, the adjustment amplification factor a calculated by the amplification factor correcting circuit 25 is stored in the memory 26. This completes the operation of obtaining the adjustment amplification factor $\alpha$.

Figure 6:
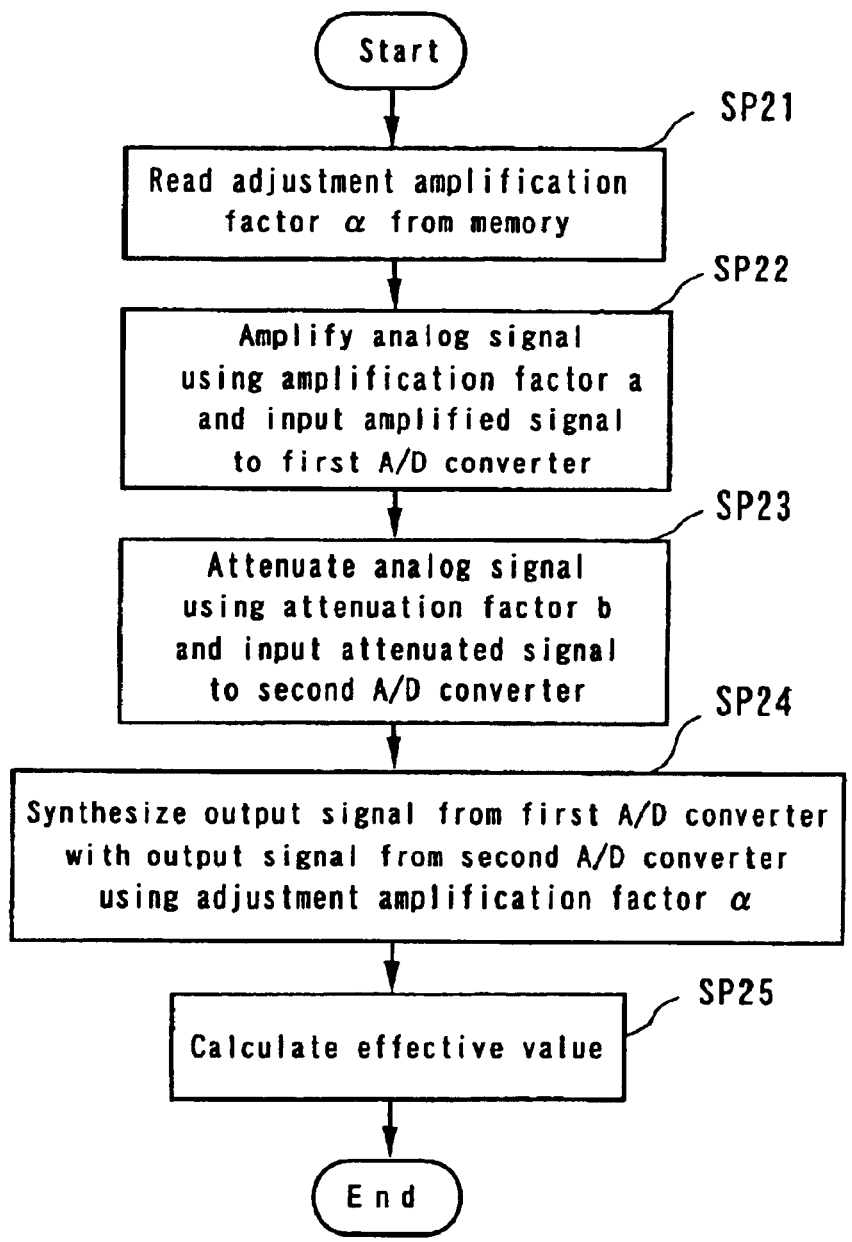
FIG. 6 is a flow chart of signal processing executed using an adjustment amplification factor $\alpha$.

Next, FIG. 6 shows signal processing using the adjustment amplification factor $\alpha$. At step SP21, the synthesizing circuit 22 reads the adjustment amplification factor $\alpha$ from the memory 26.

At step SP22, an analog signal outputted by the microphone 11 is transmitted through the input switch 12 and the input amplifier 13 to the amplifying circuit 14, where it is amplified using the amplification factor a and is then inputted to the first A/D converter 16. At step SP23, an analog signal outputted by the microphone 11 is transmitted through the input switch 12 and the input amplifier 13 to the attenuating circuit 15, where it is attenuated using the attenuation factor b and is then inputted to the second A/D converter 17.

Then, at step SP24, the synthesizing circuit 22 processes an output signal from the first A/D converter 16 taking into account an amplification factor a·$\alpha$ obtained by multiplying the amplification factor a by the adjustment amplification factor $\alpha$. On the other hand, the synthesizing circuit 22 processes an output signal from the second A/D converter 17 taking only the attenuation factor b into account and synthesizes the processed signals with each other. Then, at step SP25, the effective-value calculating circuit 23 calculates an effective value to complete the signal processing using the adjustment amplification factor $\alpha$. The effective value is displayed by the display 19.

Now, with reference to the flow chart in FIGS. 7 and 8, description will be given of another operation of the automatic adjusting apparatus according to the second embodiment of the present invention, i.e. another embodiment of a method of adjusting the amplification factor of the signal processing circuit.

Figure 7:
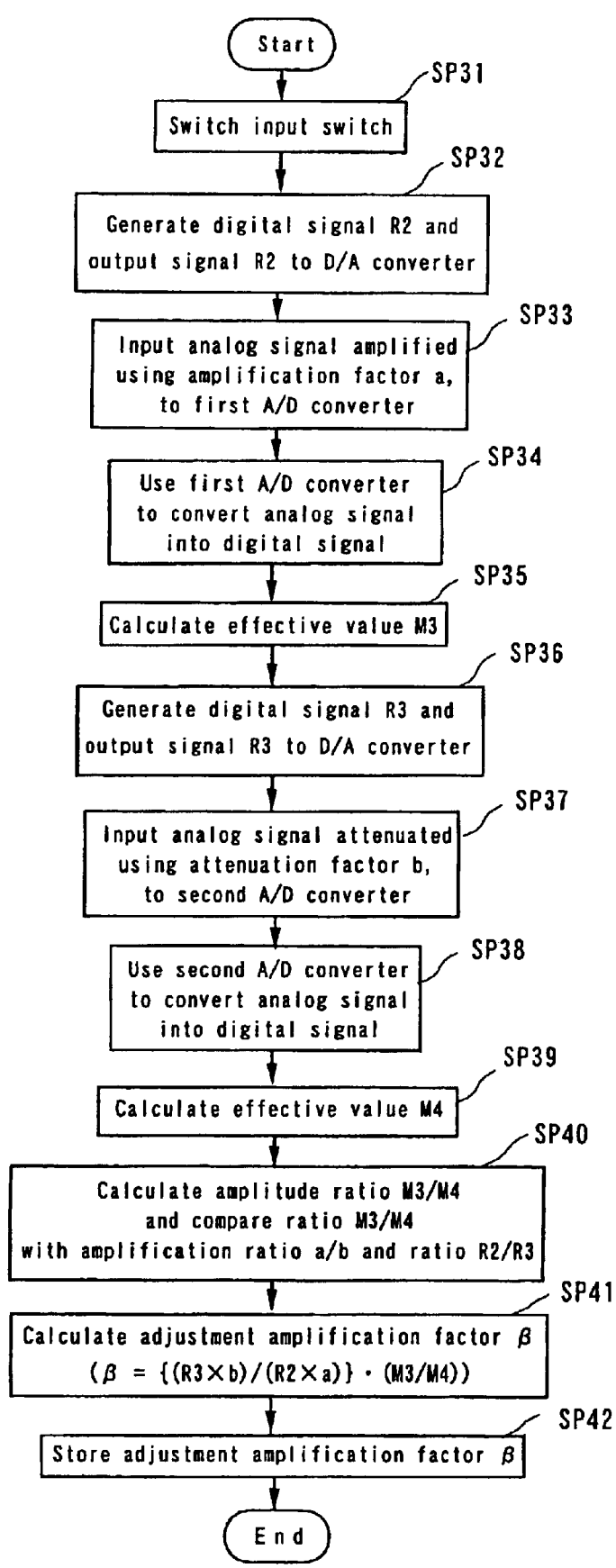
FIG. 7 is a flow chart of an operational procedure executed if an amplification factor adjusting device of a signal processing circuit according to another embodiment is used.

FIG. 7 shows an operation of obtaining the adjustment amplification factor $\beta$. First, at step SP31, the input switch 12 is switched so as to constitute a circuit for an operation of adjusting the amplification factor.

At step SP32, the digital signal generating circuit 21 generates the second digital signal R2 of a predetermined amplitude as a reference signal. It then outputs this signal to the D/A converter 20.

At step SP33, the reference signal converted into an analog signal by the D/A converter 20 is transmitted through the input switch 12 and the input amplifier 13 to the amplifying circuit 14, where it is amplified using the amplification factor a and is then inputted to the first A/D converter 16.

Then, at step SP34, the analog signal amplified using the amplification factor a is converted into a digital signal by the first A/D converter 16. Furthermore, at step SP35, the effective-value calculating circuit 23 executes an arithmetic process on the digital signal provided by the first A/D converter 16 to calculate the effective value M3.

Further, at step SP36, the digital signal generating circuit 21 generates the third digital signal R3 of a predetermined amplitude as a reference signal. It then outputs this signal to the D/A converter 20.

At step SP37, the reference signal converted into an analog signal by the D/A converter 20 is transmitted through the input switch 12 and the input amplifier 13 to the attenuating circuit 15, where it is attenuated using the attenuation factor b and is then inputted to the second A/D converter 17.

Then, at step SP38, the analog signal attenuated using the attenuation factor b is converted into a digital signal by the second A/D converter 17. Furthermore, at step SP39, the effective-value calculating circuit 23 executes an arithmetic process on the digital signal provided by the second A/D converter 17 to calculate the effective value M4.

At step SP40, the comparing circuit 24 calculates the amplitude ratio (M3/M4) of the effective value M3 based on an output signal from the first A/D converter 16 and the effective value M4 based on an output signal from the second A/D converter 17, the effective values being calculated by the effective-value calculating circuit 23, and compares this amplitude ratio with the amplification ratio (a/b) of the amplifying circuit 14 to the attenuating circuit 15 and the ratio of the input signals (R2/R3). In this regard, the effective value is not necessarily used if the comparing circuit 24 calculates the amplitude ratio of the output signal from the first A/D converter 16 to the output signal from the second A/D converter 17.

At step SP41, on the basis of result of the comparison carried out by the comparing circuit 24, the amplification factor correcting circuit 25 calculates the adjustment amplification factor $\beta$ for the signal synthesis of the analog signal inputted to the amplifying circuit 14 (={(R3·b)/(R2·a)}·(M3/M4)). An adjustment amplification factor $\beta'(=1/\beta)$, the inverse of the adjustment amplification factor $\beta$, can be used for the signal synthesis of the analog signal inputted to the attenuating circuit 15.

At step SP42, the adjustment amplification factor $\beta$ calculated by the amplification factor correcting circuit 25 is stored in the memory 26. This completes the operation of obtaining the adjustment amplification factor $\beta$.

Figure 8:
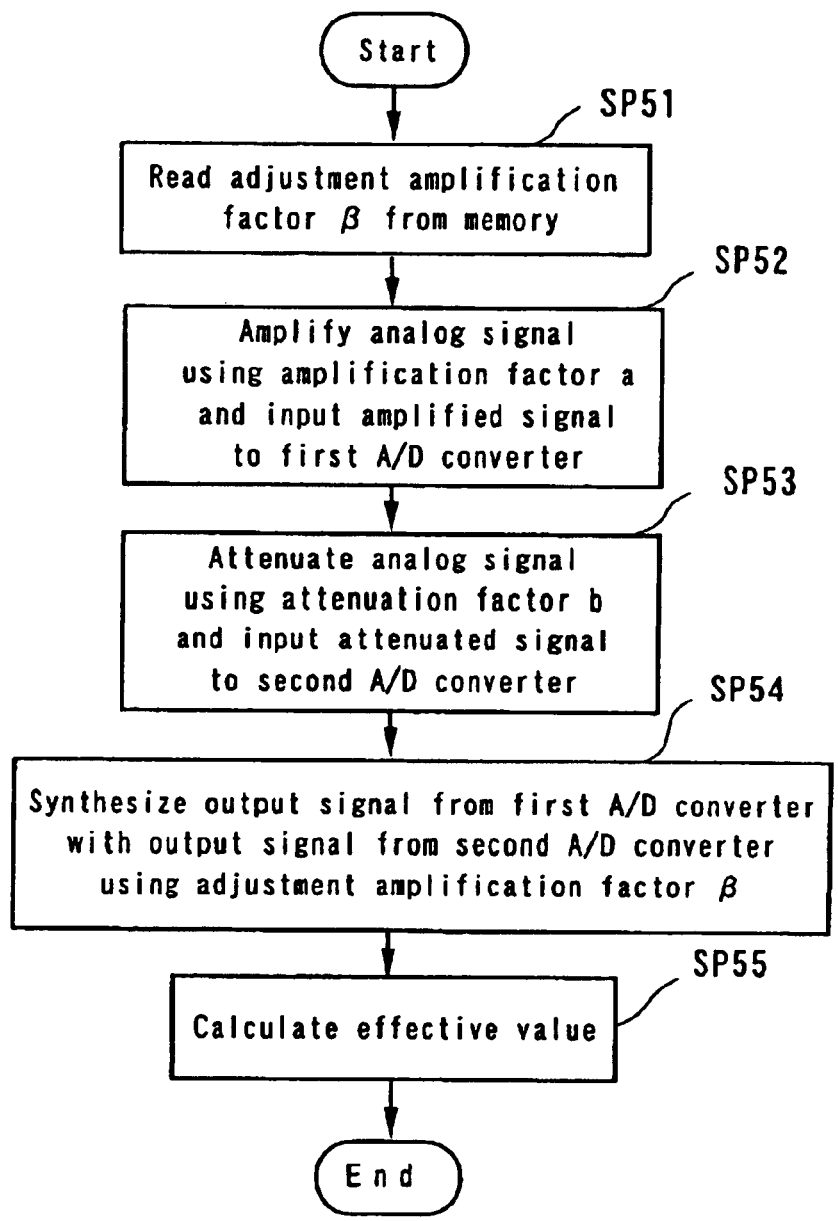
FIG. 8 is a flow chart of signal processing executed using an adjustment amplification factor $\beta$.

Next, FIG. 8 shows signal processing using the adjustment amplification factor $\beta$. At step SP51, the synthesizing circuit 22 reads the adjustment amplification factor $\beta$ from the memory 26.

At step SP52, an analog signal outputted by the microphone 11 is transmitted through the input switch 12 and the input amplifier 13 to the amplifying circuit 14, where it is amplified using the amplification factor a and is then inputted to the first A/D converter 16. On the other hand, at step SP53, an analog signal outputted by the microphone 11 is transmitted through the input switch 12 and the input amplifier 13 to the attenuating circuit 15, where it is attenuated using the attenuation factor b and is then inputted to the second A/D converter 17.

Then, at step SP54, the synthesizing circuit 22 processes an output signal from the first A/D converter 16 taking into account an amplification factor a·$\beta$ obtained by multiplying the amplification factor a by the adjustment amplification factor $\beta$. On the other hand, the synthesizing circuit 22 processes an output signal from the second A/D converter 17 taking only the attenuation factor b into account and synthesizes the processed signals with each other. Then, at step SP55, the effective-value calculating circuit 23 calculates an effective value to complete the signal processing using the adjustment amplification factor β. The effective value is displayed by the display 19.

In the above operation of the automatic adjusting apparatus according to the second embodiment of the present invention, i.e. the above embodiment of the method of adjusting the amplification factor of the signal processing circuit, the two types of reference signals, the second digital signal R2 and the third digital signal R3, are used to allow the results of A/D conversion of the reference signals by the first and second A/D converters 16 and 17 to have values close to a full scale. This produces more accurate adjustment results than in the first embodiment, in which one type of reference signal (first digital signal R1) is used for adjustment.

Figure 9:
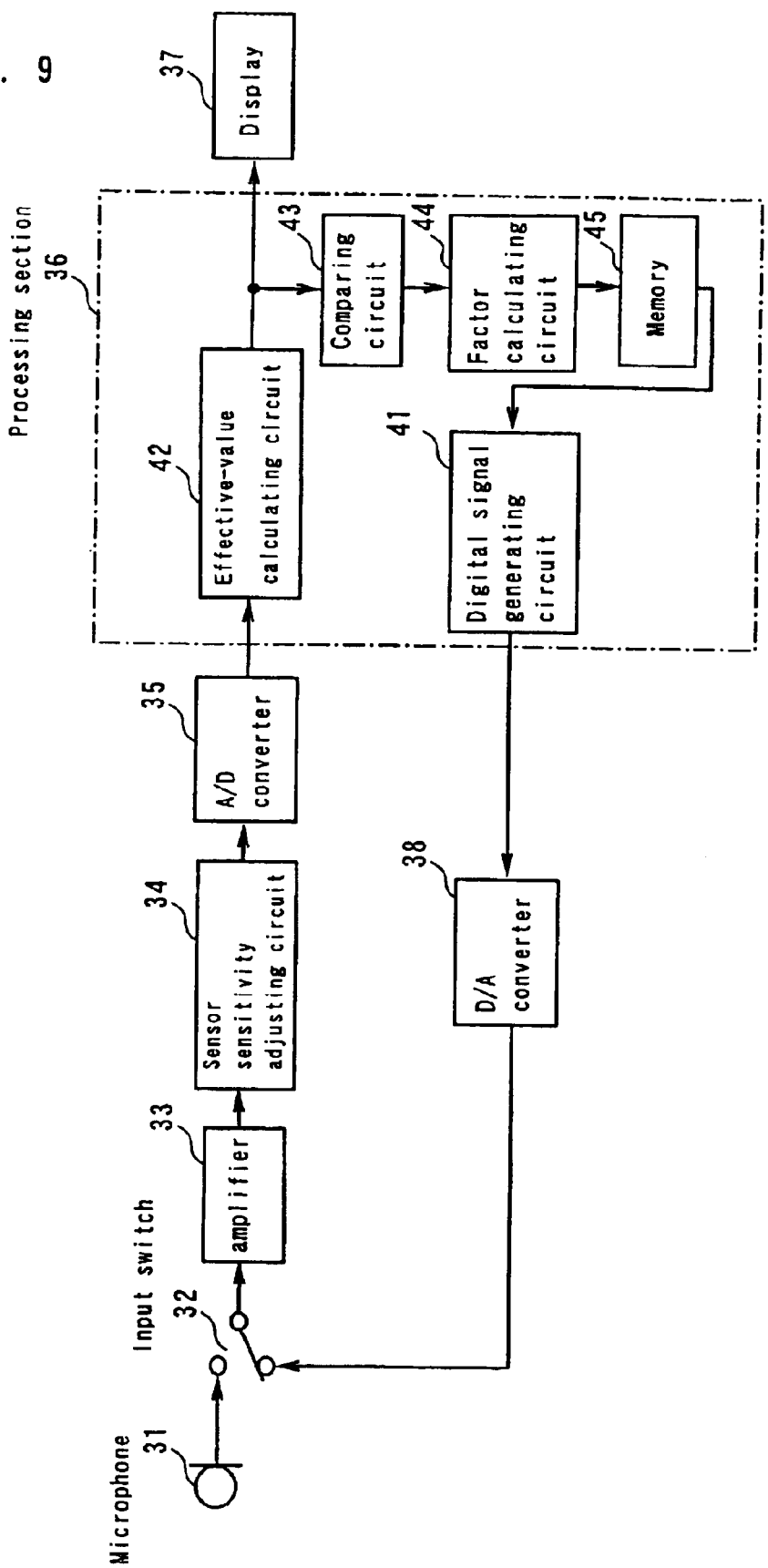
FIG. 9 is a block diagram of measuring equipment provided with an automatic adjusting apparatus according to a third embodiment of the present invention.

Next, measuring equipment provided with an automatic adjusting apparatus according to a third embodiment of the present invention comprises a microphone 31, an input switch 32, an amplifier 33, a sensor sensitivity adjusting circuit 34 composed of a variable resistor, an A/D converter 35, a processing section 36, a display 37, and a D/A converter 38 as shown in FIG. 9.

The processing section 36 is composed of a digital signal generating circuit 41 that generates a digital signal R as an internal calibration signal, an effective-value calculating circuit 42 that executes an arithmetic process on an output signal from the A/D converter 35 to calculate an effective value, a comparing circuit 43 that compares an output value from the effective-value calculating circuit 42, i.e. an effective value calculated by the effective-value calculating circuit 42, with a predetermined calibration value, a factor calculating circuit 44 that calculates an adjustment factor for the internal calibration signal on the basis of a result of the comparison executed by the comparing circuit 43, and a memory 45 that stores the adjustment factor calculated by the factor calculating circuit 44.

Here, an output value M is defined as a value actually displayed on the display 37 after the measuring equipment has adjusted the sensor sensitivity adjusting circuit 34 to complete absolute calibration and then generated the digital signal R, which has then been processed by the D/A converter 38, the input switch 32, the amplifier 33, the sensor sensitivity adjusting circuit 34, the A/D converter 35, and the effective-value calculating circuit 42. A calibration value C is defined as the value to be displayed on the display 37.

The magnitude of the digital signal R is defined as R. The magnitude of the output value M is defined as M. The magnitude of the calibration value C is defined as C.

Now, description will be given of an adjustment factor α and its calculating method. After the measuring equipment has completed absolute calibration, the I/O relationship (x: input signal, y: output signal) in the circuit composed of the input switch 32, the amplifier 33, the sensor sensitivity adjusting circuit 34, the A/D converter 35, and the effective-value calculating circuit 42 is linear and is expressed by y=ax (Equation 1).

The output value M is actually displayed on the display 37 when the digital signal R is generated. Accordingly, the inclination a=M/R on the basis of Equation 1.

Then, with the I/O relationship y=ax=(M/R)×(Equation 2), when the digital signal R is generated, the digital signal R is multiplied by the adjustment factor α to generate a digital signal of magnitude α·R in order to display the calibration value C on the display 37.

Then, on the basis of Equation 2, C=(M/R)·α·R and α=C/M. Accordingly, the predetermined calibration value C is displayed on the display 37 by multiplying the digital signal R by the adjustment factor α(=C/M) and carrying out internal calibration using the resultant digital signal of magnitude α·R.

With reference to the flow chart in FIGS. 10 and 11, description will be given of operation of the automatic adjusting apparatus according to the third embodiment of the present invention, i.e. a method of automatically adjusting an internal calibration signal according to the present invention.

Figure 10:
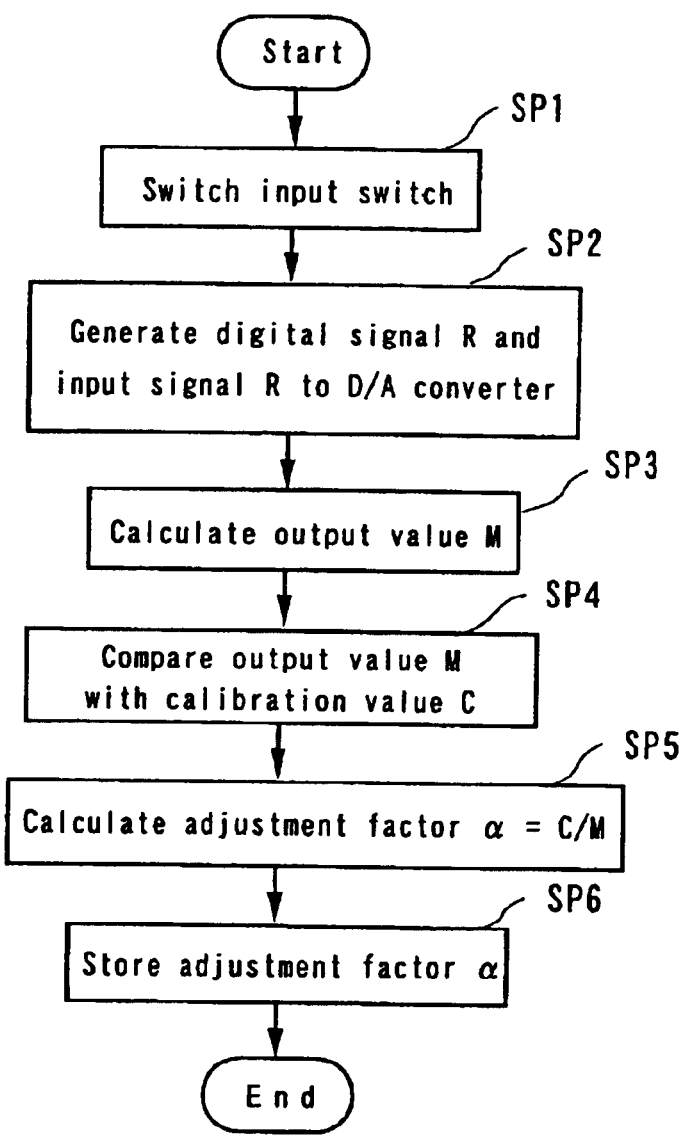
FIG. 10 is a flow chart of a procedure of obtaining an adjustment factor for an internal calibration signal.

FIG. 10 shows an operation of obtaining the adjustment factor α for the internal calibration signal. First, at step SP1, the input switch 32 is switched so as to constitute an internal calibration circuit.

At step SP2, the digital signal generating circuit 41 generates the digital signal R of magnitude R and then outputs this signal to the D/A converter 38.

At step SP3, the effective-value calculating circuit 42 executes an arithmetic process on the digital signal R to calculate the output value M of magnitude M, the digital signal R having been processed by the input switch 32, the amplifier 33, the sensor sensitivity adjusting circuit 34, and the A/D converter 35.

At step SP4, the comparing circuit 43 compares the output value M with the calibration value C of magnitude C already stored as an output value for the digital signal R. In this regard, the effective value is not necessarily used if the comparing circuit 43 compares the output value M with the calibration value C.

At step SP5, the factor calculating circuit 44 calculates the adjustment factor α(=C/M) on the basis of the calculation method described above using the digital signal R, the calibration value C already obtained, the output value M actually detected and obtained.

Furthermore, at step SP6, the factor calculating circuit 44 stores the adjustment factor α in the memory 45 to complete the operation of obtaining the adjustment factor α for the internal calibration signal.

Figure 11:
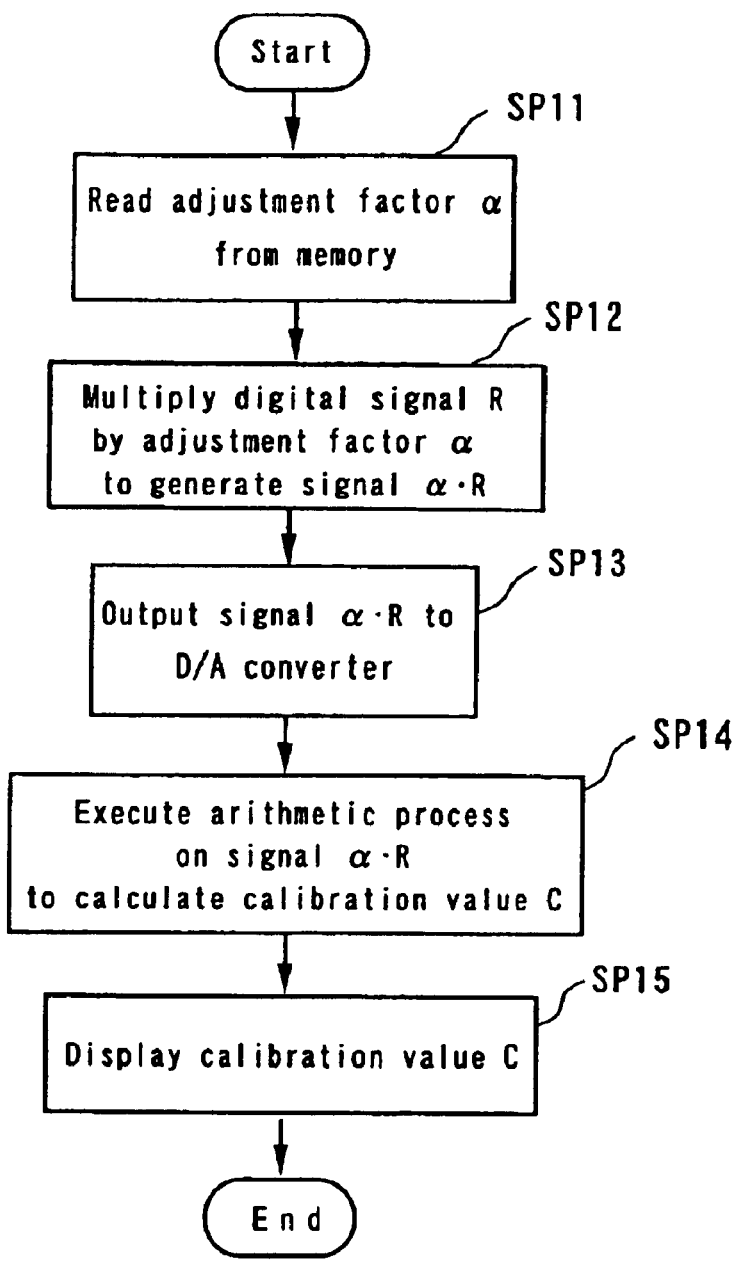
FIG. 11 is a flow chart of an internal calibration procedure.

Next, FIG. 11 shows an internal calibration operation. At step SP11, the digital signal generating circuit 41 first reads the adjustment factor α from the memory 45.

At step SP12, the digital signal generating circuit 41 multiplies the digital signal R by the adjustment factor α to generate a signal of magnitude α·R. At step SP13, the digital signal generating circuit 41 outputs the signal of magnitude α·R to the D/A converter 38.

At step SP14, the effective-value calculating circuit 42 executes an arithmetic process on the signal of magnitude α·R to calculate the calibration value C, the signal of magnitude α·R having been processed by the input switch 32, the amplifier 33, the sensor sensitivity adjusting circuit 34, and the A/D converter 35. At step SP15, the calibration value C is displayed on the display 37 to complete the internal calibration operation.

In this manner, the adjustment factor α is used to adjust the digital signal R as an internal calibration signal. This eliminates the need for a manual adjusting operation performed during a conventional internal calibration operation to adjust variable resistances so that the displayed value is closer to a specified value.

Figure 12:
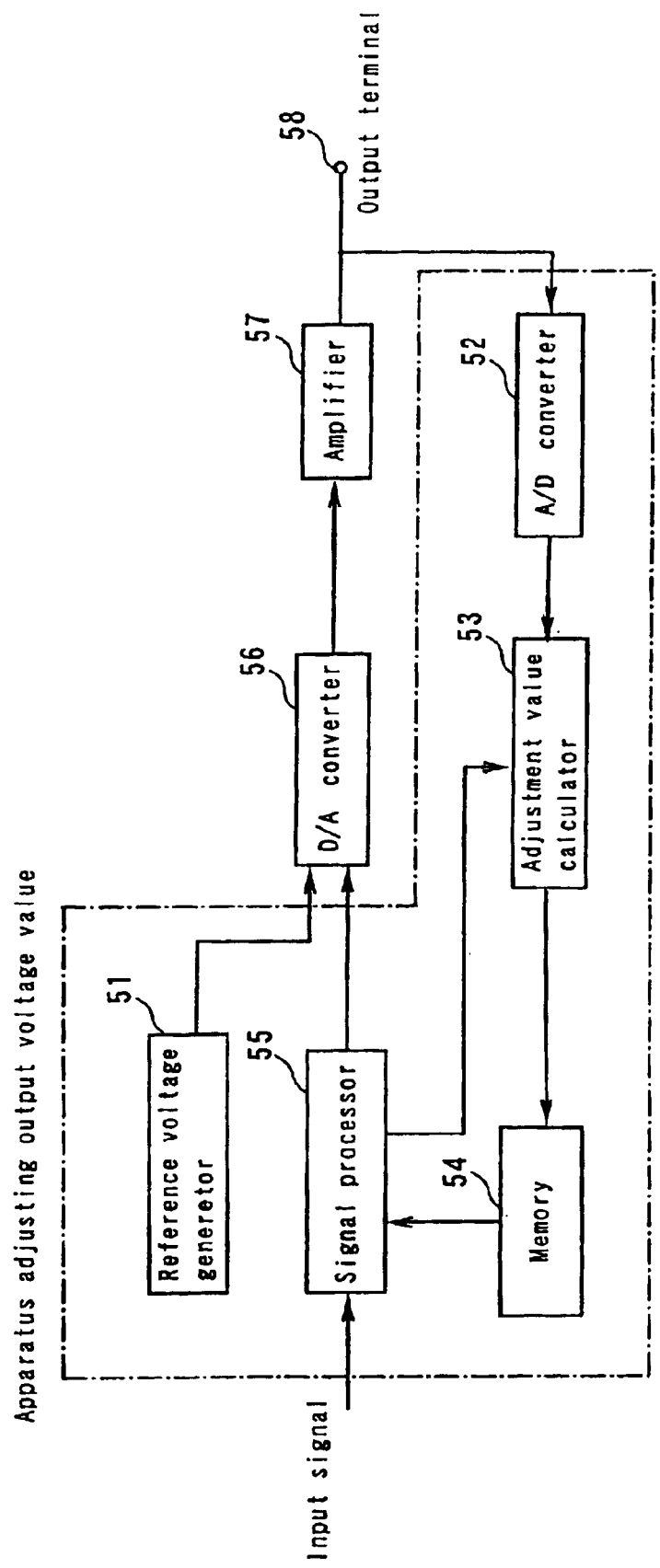
FIG. 12 is a block diagram of measuring equipment provided with an automatic adjusting apparatus according to a fourth embodiment of the present invention.

As shown in FIG. 12, an automatic adjusting apparatus according to a fourth embodiment of the present invention comprises a reference voltage generator 51 that generates a reference voltage, an A/D converter 52 that subjects an output terminal voltage to A/D conversion, the output terminal voltage resulting from the reference voltage generated by the reference voltage generator 51, an adjustment value calculator 53 that calculates a correction factor using a desired output terminal voltage and a desired reference voltage for an output signal from the A/D converter 52 and the reference voltage generated by the reference voltage generator 51, respectively, a memory 54 that stores a correction factor calculated by the adjustment value calculator 53, and a signal processor 55 that reads the correction factor from the memory 54 and calculates a correction value from an input signal to be measured and the correction factor.

A D/A converter 56 and an amplifier 57 constitute an output circuit provided in an acoustic measuring instrument normally between a DSP and an output terminal 58.

The reference voltage generator 51, the A/D converter 52, the adjustment value calculator 53, the memory 54, and the signal processor 55 can each be constructed using the DSP or CPU (Central Processing Unit) provided in the acoustic measuring instrument.

The reference voltage generator 51 generates two types of reference voltages RV1 and RV2 and outputs these voltages to the D/A converter 56.

Here, voltages M1 and M2 are defined to be actually detected at the output terminal 58 when the two types of reference voltages RV1 and RV2 outputted by the reference voltage generator 51 pass through the D/A converter 56 and the amplifier 57. Further, voltages I1 and I2 are defined to be detected at the output terminal 58 when the two types of reference voltages RV1 and RV2 outputted by the reference voltage generator 51 pass through the D/A converter 56 and the amplifier 57.

An equation $y=ax+b$ (Equation 1) is defined as an actual I/O relationship (x: input signal, y: output signal) in the output circuit composed of the D/A converter 56 and amplifier 57. The desired I/O relationship is defined by $y=a_0x+b_0$ (Equation 2). Correction factors $\alpha$ and $\beta$ are used to correct the input signal x so that $\alpha x+\beta$. The corrected value $x'(=\alpha x+\beta)$ is inputted to the D/A converter 56 to output the desired output signal y to the output terminal 58.

Thus, the correction factors $\alpha$ and $\beta$ are calculated using six values including the two types of reference voltages RV1 and RV2, the actual terminal voltages M1 and M2 resulting from the two types of reference voltages RV1 and RV2, and the desired terminal voltages I1 and I2.

$$y=a(\alpha x+\beta)+b=a\alpha x+a\beta+b=a_0x+b_0. \text{ Accordingly, } a\alpha=a_0 \text{ and } \alpha\beta+b=b_0.$$

Consequently, $\alpha=a_0/a$ and $\beta=(b_0-b)/a$.

The inclination a, the intercept b, the desired inclination $a_0$, and the desired intercept $b_0$ are each expressed using the six values RV1, RV2, M1, M2, I1, and I2.

On the basis of Equation 1, $a=(M1-M2)/(RV1-RV2)$ and $b=(M2 \cdot RV1-M1 \cdot RV2)/(RV1-RV2)$. On the basis of Equation 2, $a_0=(I1-I2)/(RV1-RV2)$ and $b_0=(I2 \cdot RV1-I1 \cdot RV2)/(RV1-RV2)$.

Accordingly, $\alpha=a_0/a=(I1-I2)/(M1-M2)$, and $\beta=(b_0-b)/a=\{(M1-I1) \cdot RV2+(I2-M2) \cdot RV1\}/(M1-M2)$.

Therefore, the correction factors $\alpha$ and $\beta$ can be expressed using the six values RV1, RV2, M1, M2, I1, and I2.

With reference to the flow chart shown in FIGS. 13 and 14, description will be given of operation of the automatic adjusting apparatus according to the fourth embodiment of the present invention configured as described above, i.e. a method of adjusting an output voltage value.

Figure 13:
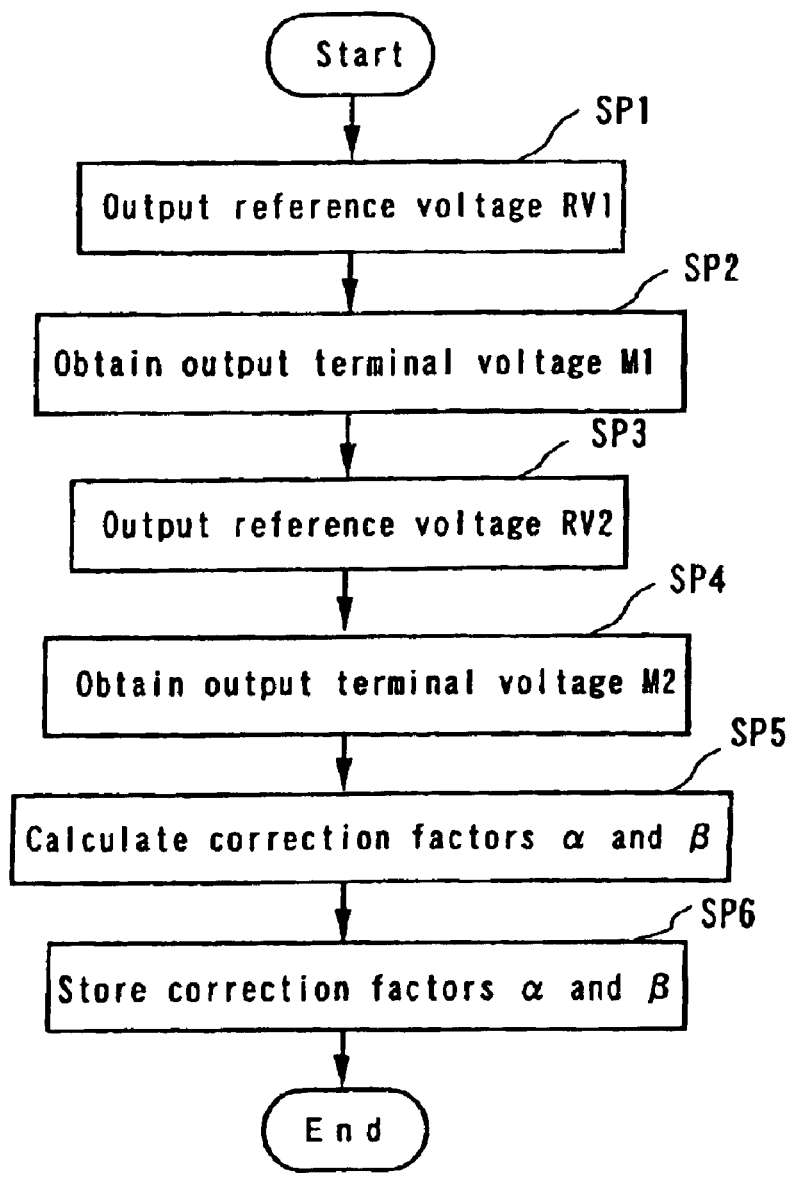
FIG. 13 is a flow chart of an adjusting operation during manufacture.

FIG. 13 shows an operation of calculating the correction factors $\alpha$ and $\beta$, an adjusting operation included in the manufacture of an acoustic measuring instrument. At step SP1, the reference voltage generator 51 outputs the reference voltage RV1. At step SP2, the adjustment value calculator 53 obtains, via the A/D converter 52, the voltage M1 detected at the output terminal 58 as a result of the reference voltage RV1.

Similarly, at step SP3, the reference voltage generator 51 outputs the reference voltage RV2. At step SP4, the adjustment value calculator 53 obtains, via the A/D converter 52, the voltage M2 detected at the output terminal 58 as a result of the reference voltage RV2.

Then, at step SP5, the adjustment value calculator 53 calculates the correction factors $\alpha$ and $\beta$ on the basis of the above described calculation method using the two types of reference voltages RV1 and RV2, the desired terminal voltages I1 and I2 already obtained, and the terminal voltages M1 and M2 actually detected and obtained.

Furthermore, at step SP6, the adjustment value calculator 53 stores the correction factors $\alpha$ and $\beta$ in the memory 54 to complete the operation of adjusting the calculation of the correction factors.

Figure 14:
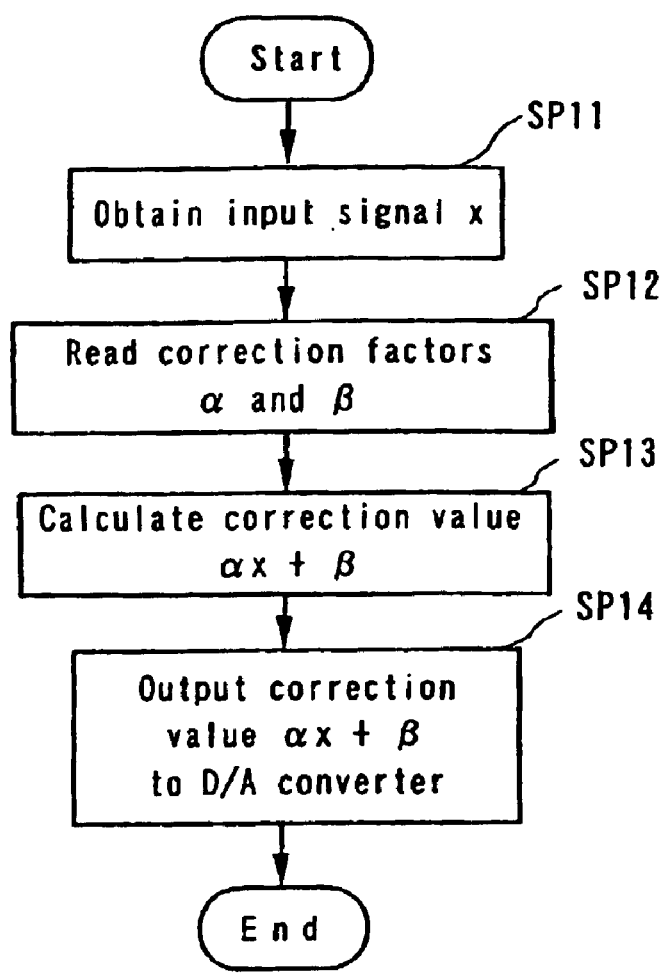
FIG. 14 is a flow chart of an adjusting operation during measurement.

Next, an adjusting operation is performed during measurement using the correction factors $\alpha$ and $\beta$ as shown in FIG. 14. At step SP11, the signal processor 55 obtains the input signal x to be measured.

Then, at step SP12, the signal processor 55 reads the correction factors $\alpha$ and $\beta$ from the memory 54. At step SP13, the signal processor 55 calculates the correction value $\alpha x+\beta$ from the input signal x and the correction factors $\alpha$ and $\beta$.

Moreover, at step SP14, the signal processor 55 outputs the correction value $\alpha x+\beta$ to the D/A converter 56 to complete the measuring operation using the correction factors.

Thus, by using the correction factors $\alpha$ and $\beta$ to adjust the input signal x, it is possible to eliminate the need for an adjusting operation based on variable resistances and associated with differences in part characteristics of the D/A converter 56 and amplifier 57.

Figure 15:
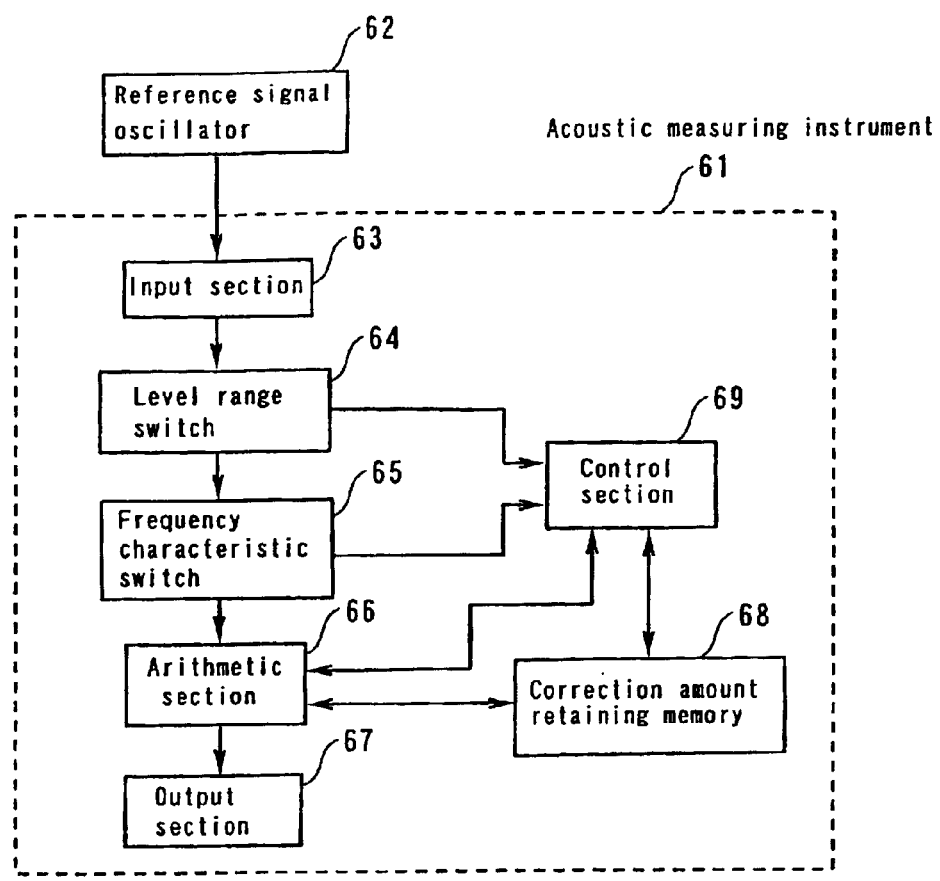
FIG. 15 is a block diagram of an acoustic measuring instrument provided with an automatic adjusting apparatus according to a fifth embodiment of the present invention.

An acoustic measuring instrument provided with an automatic adjusting apparatus according to a fifth embodiment of the present invention is composed of an acoustic measuring instrument 61 and a reference signal oscillator 62 that generates a reference signal, as shown in FIG. 15. The reference signal oscillator 62 may be incorporated into the acoustic measuring instrument 61.

Further, the acoustic measuring instrument 61 comprises an input section 63, a level range switch 64, a frequency characteristic switch 65, an arithmetic section 66, an output section 67 having a display section, an external output terminal, and the like, a correction amount retaining memory 68, and a control section 69. The acoustic measuring instrument may comprise only one of the level range switch 64 and frequency characteristic switch 65.

The reference signal oscillator 62 inputs a predetermined reference signal (for example, an electric signal corresponding to a sound pressure level of 94 dB) to the input section 63.

The level range switch 64 has a plurality of level ranges (for example, the number of level ranges N=7) used to select a maximum input level according to the level of an input signal. The level range switch 64 amplifies the reference signal or an input signal to be measured and then outputs the amplified signal to the frequency characteristic switch 65.

Furthermore, the frequency characteristic switch 65 has a plurality of frequency characteristic ranges (for example, the number of frequency characteristic ranges M=8) used to select a correction circuit that corrects the frequency characteristic of an input signal. The frequency characteristic switch 65 amplifies the reference signal or an input signal to be measured and then outputs the amplified signal to the arithmetic section 66.

The arithmetic section 66 uses the reference signal to calculate a correction amount from an error in amplification factor for each range of the level range switch 64 or frequency characteristic switch 65. The arithmetic section 66 reads, from the correction amount retaining memory 68, the correction amount corresponding to that range of the range switch which is selected for actual measurement. The arithmetic section 66 then adds the read correction amount to a measured value to obtain a calculated value and then outputs this value to the output section 67.

The correction amount retaining memory 68 stores the correction amount calculated by the arithmetic section 66 for each range of the level range switch 64 or frequency characteristic switch 65 so that the correction amounts correspond to the respective range of the level range switch 64 or frequency characteristic switch 65.

The control section 69 monitors which range for the level range switch 64 or the frequency characteristic switch 65 has been selected. It provides this selection information to the arithmetic section 66 or the correction amount retaining memory 68 to control an operation of writing the correction amount calculated by the arithmetic section 66, in the correction amount retaining memory 68, an operation of reading the correction amount from the correction amount retaining memory 68 into the arithmetic section 66, and other operations. The control section 69 thus smoothly carries out automatic correction of switching errors associated with range switching.

The arithmetic section 66 and the control section 69 constitute correction amount calculating means for using the reference signal to calculate a correction amount from an error in amplification factor for each range of the level range switch 64 or frequency characteristic switch 65 and correction processing means reading, from the correction amount retaining memory 68, the correction amount corresponding to that range of the level range switch 64 or frequency characteristic switch 65 which is selected for actual measurement and adding the read correction amount to a measured value, respectively.

With reference to the flow chart shown in FIGS. 16 to 19, description will be given of operation of the automatic adjusting apparatus according to the fifth embodiment of the present invention configured as described above, i.e. a method of automatically correcting switching errors associated with range switching.

Figure 16:
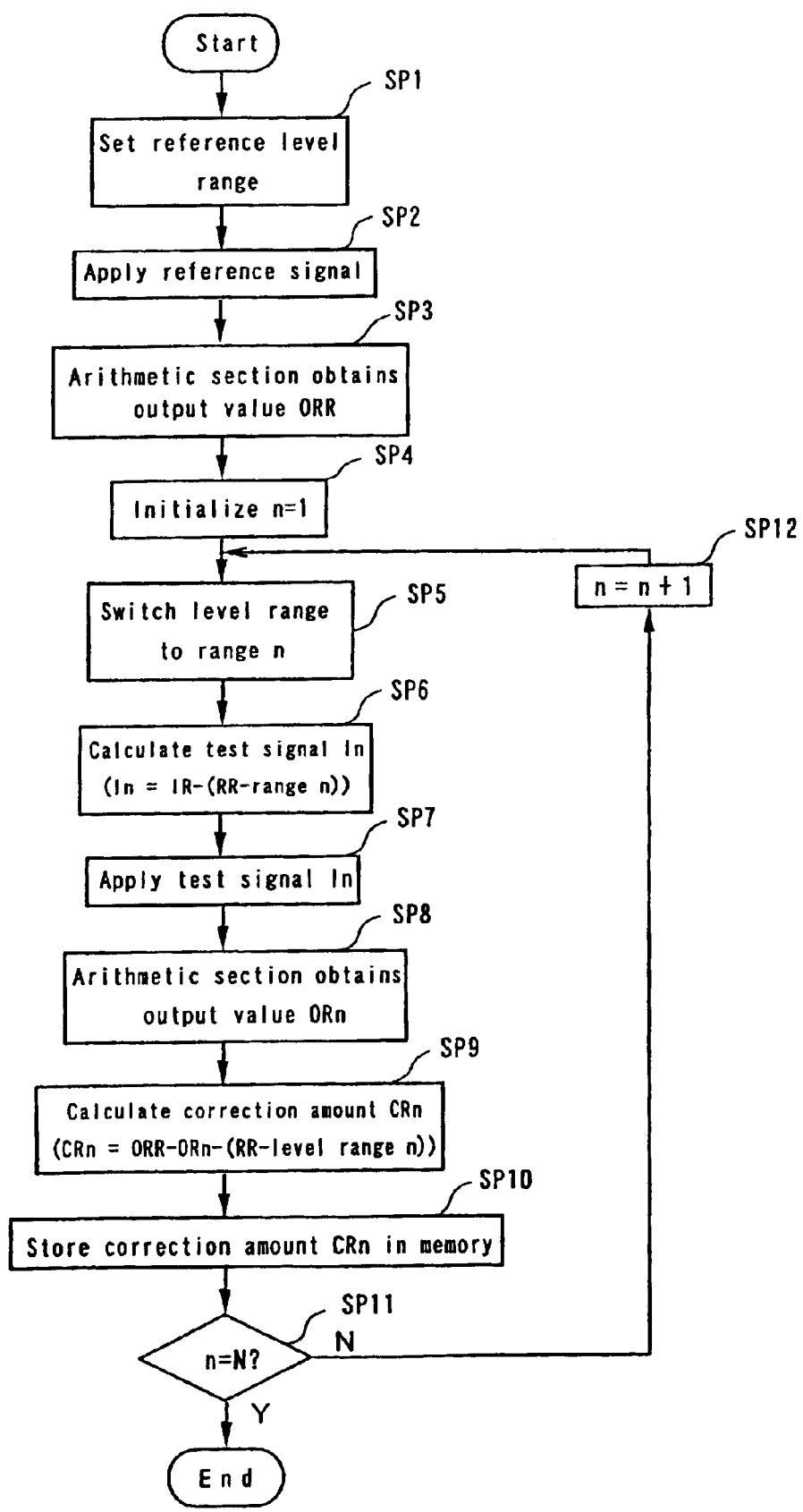
FIG. 16 is a flow chart of calculation of a correction amount for a switching error in a level range switch.

FIG. 16 shows a procedure of calculating a correction amount for a switching error in the level range switch 64. At step SP1, the level range switch 64 is set to a reference level range RR (for example, 120 dB).

Then, at step SP2, the reference signal IR (for example, an acoustic signal of sound pressure level of 94 dB) is applied to the input section 63. Then, at step SP3, the arithmetic section 66 processes the reference signal IR to obtain a reference level range output value ORR (for example, 93.5 dB).

Then, at step SP4, a counter for the control section 69 is initialized (n=1). Subsequently, at step SP5, the level range switch 64 is switched to a level range n (for example, 70 dB). Then, at step SP6, a test signal In is calculated.

The test signal In=reference signal IR−(reference level range RR−level range n). Consequently, for example, substitution of parenthesized specific values results in the test signal In=94−(120−70)=44 dB.

Then, at step SP7, the test signal In (for example, 44 dB) is applied to the level range n of the level range switch 64. Then, at step SP8, the arithmetic section 66 calculates a level range n output value ORn. At step SP9, a correction amount CRn for the level range n is calculated.

The correction amount CRn=reference level range output value ORR−level range n output value ORn−(reference level range RR−level range n). Consequently, for example, substitution of parenthesized specific values results in the correction amount CRn=93.5−43−(120−70)=0.5 dB.

Then, at step SP10, the correction amount CRn (for example, 0.5 dB) is stored in the correction amount retaining memory 68. Furthermore, at step SP1, it is determined whether or not n=7 (the number of level ranges N=7). Determining that n=7 completes the operation of calculating the correction amount for the switching error in the level range switch 64.

On the other hand, once it is determined that n is not 7, the procedure proceeds to step SP12 to set n=n+1 and then returns to step SP5 to perform a similar operation. The correction amount CRn (n=1 to 7) corresponding to the level range n (n=1 to 7) is stored in the correction amount retaining memory 68. This completes the operation of calculating the correction amount for the switching error in the level range switch 64.

Figure 17:
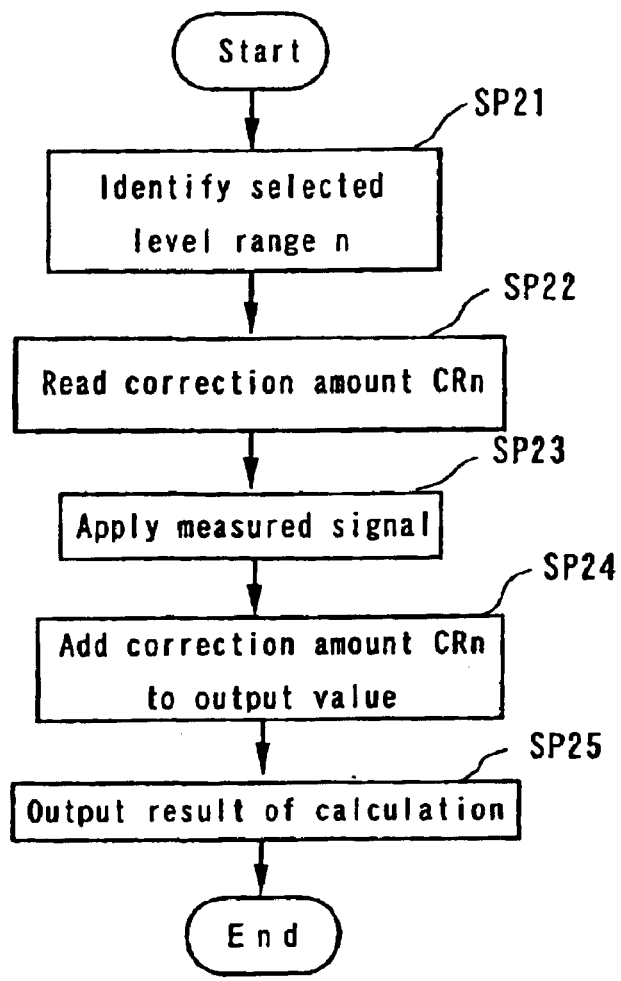
FIG. 17 is a flow chart of automatic correction of a switching error in a level range switch.

Next, FIG. 17 shows a procedure of automatically correcting a switching error in the level range switch 64. At step SP21, a selected level range of the level range switch 64 is identified. For example, the level range n is assumed to have been selected.

Then, at step SP22, the correction amount CRn corresponding to the level range n is read from the correction amount retaining memory 68. Then, at step SP23, a measured signal to be measured is applied to the input section 63.

At step SP24, the arithmetic section 66 calculates an output value from the measured signal. It further adds the correction amount CRn to this value. Then, at step SP25, the result of the corrective calculation is outputted to the output section 67. This completes the automatic correction of the switching error in the level range switch 64.

The calculation and storage of the correction amount CRn in the correction amount retaining memory 68 may not only be carried out during an adjusting step during the manufacture of a measuring instrument such as a sound level meter, a vibrometer, or a frequency analyzer but may also be carried out every time measurement is started.

Figure 18:
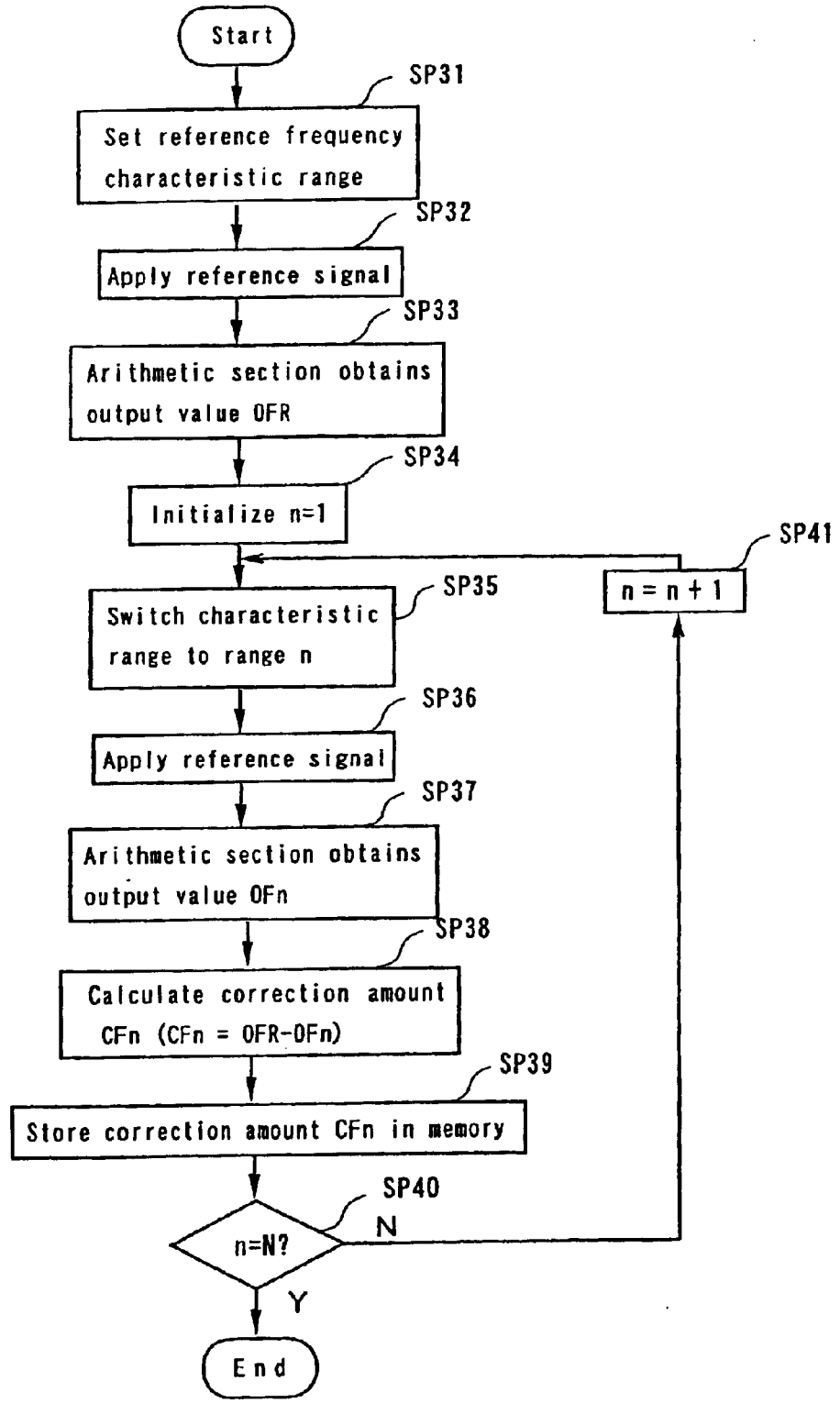
FIG. 18 is a flow chart of calculation of a correction amount for a switching error in a frequency characteristic switch.

Next, FIG. 18 shows a procedure of calculating a correction amount for a switching error in the frequency characteristic switch 65. First, at step SP31, the frequency characteristic switch 65 is set to a reference frequency characteristic range.

Then, at step SP32, the reference signal is applied to the input section 63. Then, at step SP33, the arithmetic section 66 processes the reference signal to obtain a reference frequency characteristic range output value OFR.

Then, at step SP34, a counter for the control section 69 is initialized (n=1). Subsequently, at step SP35, the frequency characteristic switch 65 is switched to a frequency characteristic range n. Then, at step SP36, the reference signal is applied.

Then, at step SP37, the arithmetic section 66 calculates a frequency characteristic range n output value OFn. At step SP38, a correction amount CFn for the frequency characteristic range n is calculated. The correction amount CFn=reference frequency characteristic range output value OFR−frequency characteristic range n output value OFn.

Then, at step SP39, the correction amount CFn is stored in the correction amount retaining memory 68. Furthermore, at step SP40, it is determined whether or not n=8 (the number of frequency characteristic ranges M=8). Determining that n=8 completes the operation of calculating the correction amount for the switching error in the frequency characteristic switch 65.

On the other hand, if n is not 8, the procedure proceeds to step SP41 to set n=n+1 and then returns to step SP35 to perform a similar operation. The correction amount CFn (n=1 to 8) corresponding to the frequency characteristic range n (n=1 to 8) is stored in the correction amount retaining memory 68. This completes the operation of calculating the correction amount for the switching error in the frequency characteristic switch 65.

Figure 19:
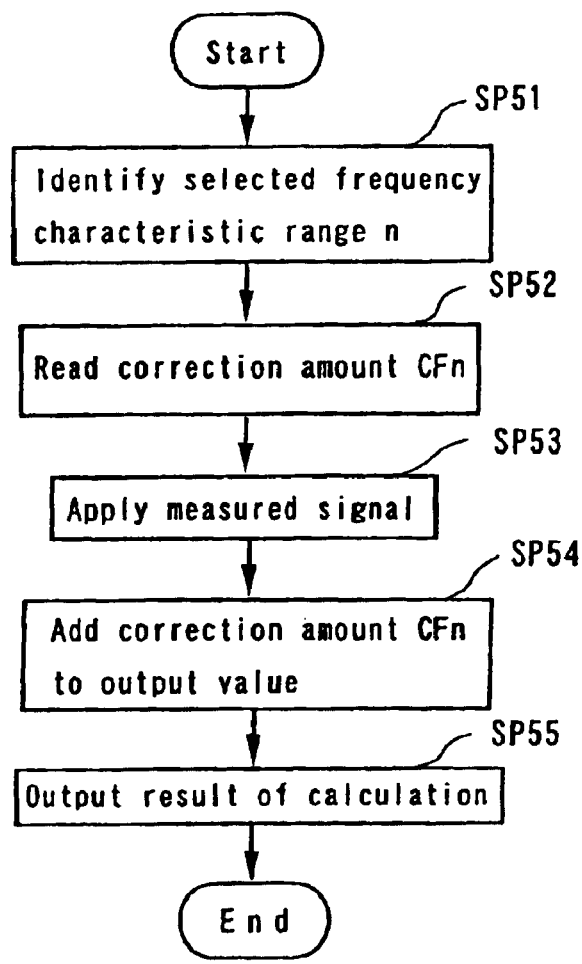
FIG. 19 is a flow chart of automatic correction of a switching error in a frequency characteristic switch.
Figure 20:
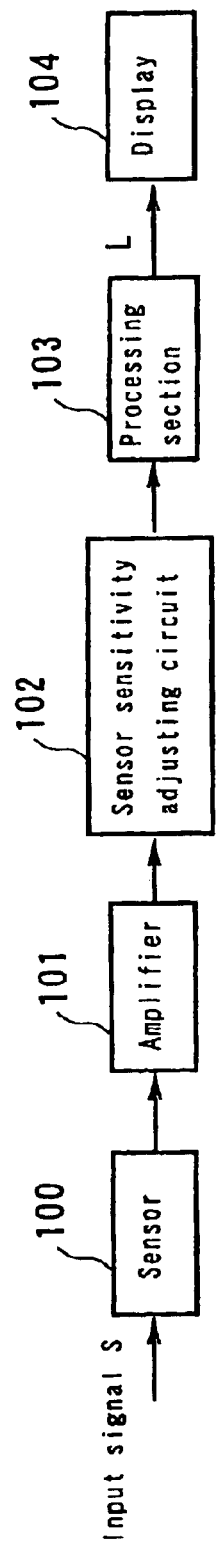
FIG. 20 is a block diagram of conventional measuring equipment.
Figure 21:
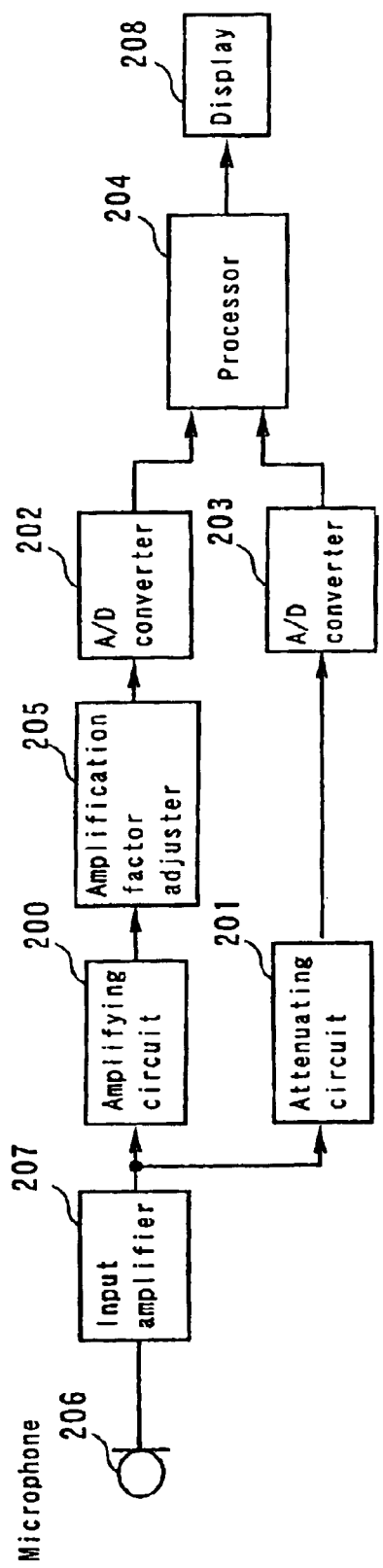
FIG. 21 is a block diagram of conventional measuring equipment provided with an amplification factor adjusting device of a signal processing circuit.
Figure 22:
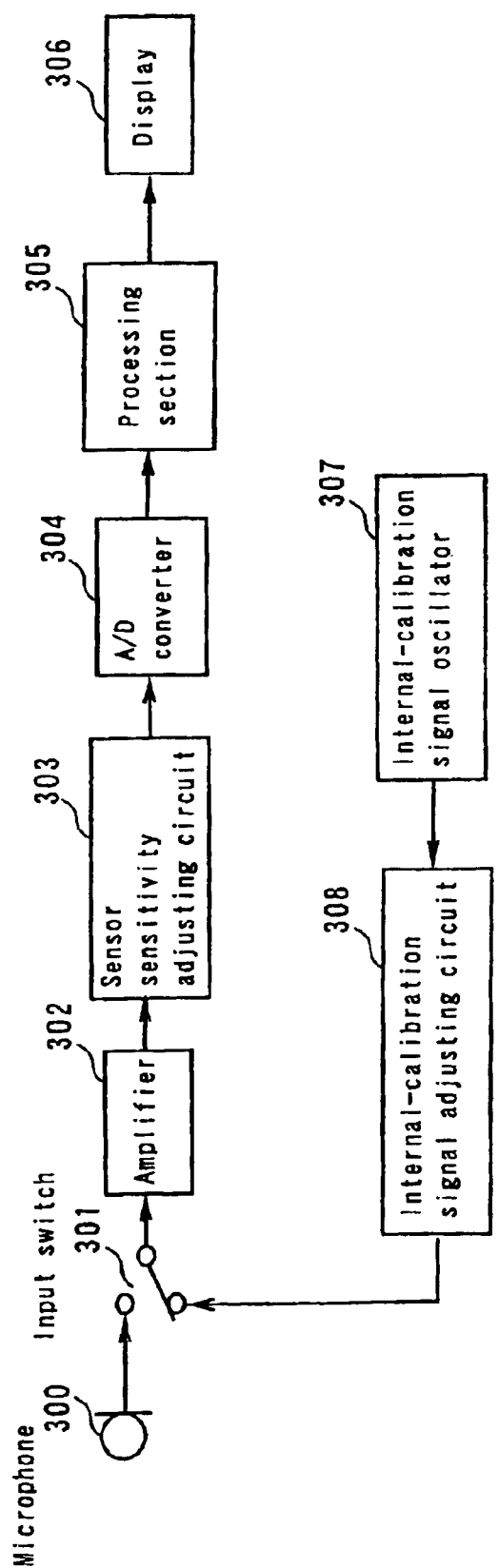
FIG. 22 is a block diagram of conventional measuring equipment provided with an apparatus for adjusting an internal calibration signal.
Figure 23:
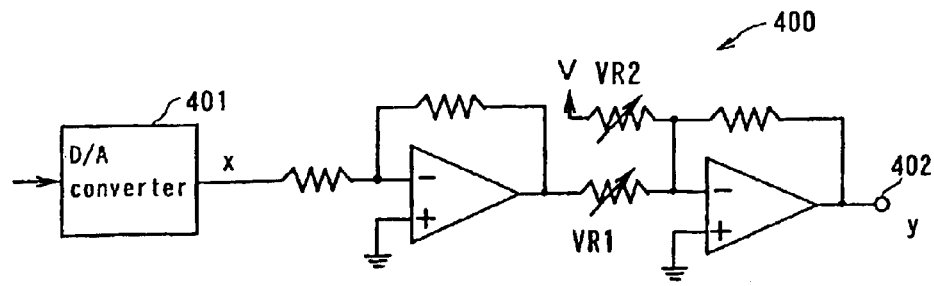
FIG. 23 is a diagram showing a configuration of an output circuit of a conventional acoustic measuring instrument.
Figure 24:
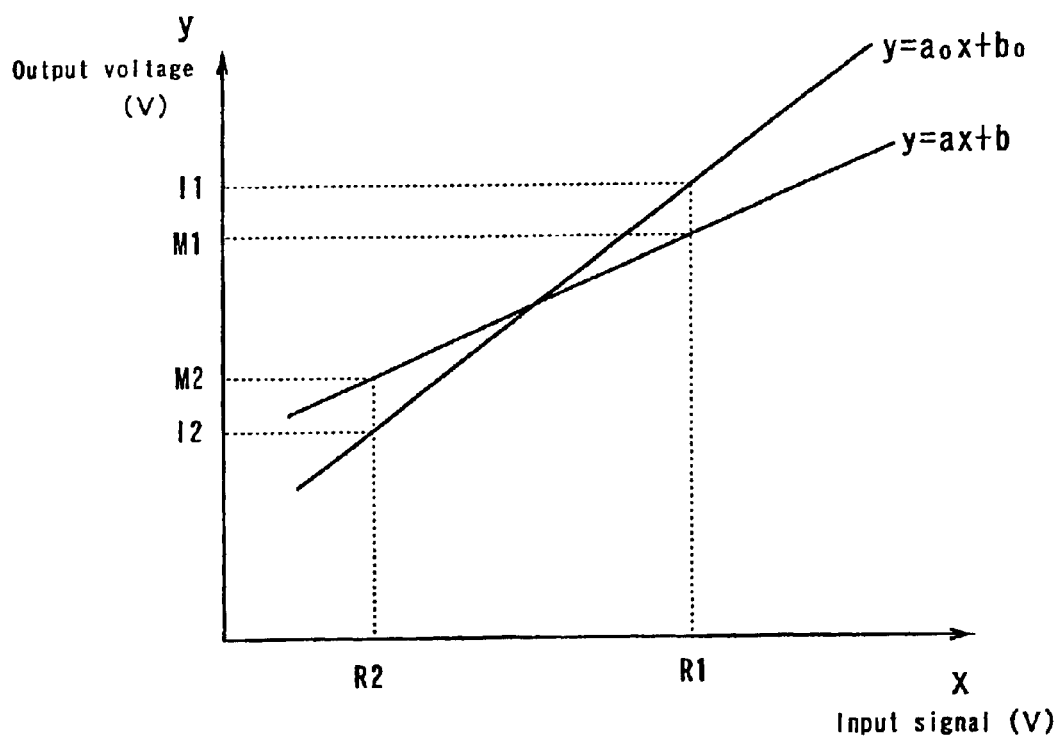
FIG. 24 is a graph showing the relationship between an input signal and an output terminal voltage in an output circuit.

Next, FIG. 19 shows a procedure of automatically correcting a switching error in the frequency characteristic switch 65. At step SP51, a selected frequency characteristic range is identified. For example, the frequency characteristic range n is assumed to have been selected.

Then, at step SP52, the correction amount CFn corresponding to the frequency characteristic range n is read from the correction amount retaining memory 68. Then, at step SP53, a measured signal to be measured is applied.

At step SP54, the arithmetic section 66 calculates an output value from the measured signal. It further adds the correction amount CFn to this value. Then, at step SP55, the result of the corrective calculation is outputted to complete the automatic correction of the switching error in the frequency characteristic switch 65.

The calculation and storage of the correction amount CFn in the correction amount retaining memory 68 may not only be carried out during an adjusting step during the manufacture of a measuring instrument such as a sound level meter, a vibrometer, or a frequency analyzer but may also be carried out every time measurement is started.

Industrial Applicability

As described above, according to the first aspect of the present invention the effects of self-noise on measured values are reduced. Accordingly, linearity can be maintained between an input signal to the sensor and the measured value even if the input signal is small in magnitude. This enables the lower limit value of a measurement range to be lowered.

According to the second aspect of the present invention, the effects of self-noise on measured values are reduced. Accordingly, linearity can be maintained between an input signal to the sensor and the measured value even if the input signal is small in magnitude. This serves to provide measuring equipment or the like having a measurement range with a lowered lower limit value.

According to the third aspect of the present invention, no manual adjusting operations are required. This contributes to reducing the number of steps required for an adjusting operation.

According to the fourth aspect of the present invention, no manual adjusting operations are required. This contributes to reducing the number of steps required for an adjusting operation. This aspect serves to provide versatile measuring equipment.

According to the fifth aspect of the present invention, no manual adjusting operations are required. This contributes to reducing the number of steps required for an adjusting operation. Further, the two types of reference signals are used for adjustment. This enables adjustment using a more accurate amplification factor.

According to the sixth aspect of the present invention, no manual adjusting operations are required. This contributes to reducing the number of steps required for an adjusting operation. Further, the two types of reference signals are used for adjustment. This enables adjustment using a more accurate amplification factor. This aspect also serves to provide versatile measuring equipment.

According to the seventh aspect of the present invention, no manual adjusting operations are required. This contributes to reducing the number of steps required for an internal calibration operation. This aspect also facilitates internal calibration.

According to the eighth aspect of the present invention, no manual adjusting operations are required. This contributes to reducing the number of steps required for an internal calibration operation. This aspect also serves to provide versatile measuring equipment.

According to the ninth aspect of the present invention, it is unnecessary to manually adjust an output voltage value using variable resistances as in the case with the manufacture of an acoustic measuring instrument. Thus, an adjusting operation can be performed in a short time. This contributes to reducing manufacturing costs.

According to the tenth aspect of the present invention, it is unnecessary to manually adjust an output voltage value using variable resistances as in the case with the manufacture of an acoustic measuring instrument. Thus, an adjusting operation can be performed in a short time. This contributes to reducing manufacturing costs.

According to the eleventh aspect of the present invention, the manufacturing costs can be reduced by applying this aspect to an acoustic measuring instrument such as a sound level meter, a vibrometer, or a frequency analyzer.

According to the twelfth aspect of the present invention, the manufacturing costs can be reduced by applying this aspect to an acoustic measuring instrument such as a sound level meter, a vibrometer, or a frequency analyzer.

According to the thirteenth aspect of the present invention, it is possible to substantially zero an error in amplification factor for each range of a range switch provided in a measuring instrument. This contributes to improving the accuracy of the measuring instrument.

According to the fourteenth aspect of the present invention, it is possible to substantially zero an error in amplification factor for each range of a range switch provided in a measuring instrument. This contributes to improving the accuracy of the measuring instrument.

According to the fifteenth aspect of the present invention, it is also possible to substantially zero an error in amplification factor for each range of a level range switch and/or a frequency characteristic switch provided in an acoustic measuring instrument such as a sound level meter, a vibrometer, or a frequency analyzer. This contributes to improving the accuracy of the acoustic measuring instrument.

According to the sixteenth aspect of the present invention, it is also possible to substantially zero an error in amplification factor for each range of a level range switch and/or a frequency characteristic switch provided in an acoustic measuring instrument such as a sound level meter, a vibrometer, or a frequency analyzer. This contributes to improving the accuracy of the acoustic measuring instrument.

Although there have been described what are the Present embodiments of the invention, it will be understood to those skilled in the art that variations and modifications may be made thereto without departing from the spirit or essence of the invention. The scope of the invention is indicated by the appended claims.

What is claimed is:

1. A measuring equipment automatic adjusting method of correcting self-noise of an output signal of a measuring equipment sensor, the sensor having a sensitivity associated therewith, the method comprising the steps of:

amplifying the output signal from the sensor so as to conform to the sensitivity of the sensor, further processing the amplified signal, outputting the processed signal as a measured value, calculating a self-noise component from the sensor sensitivity, calculating a correction value using the self-noise component as an element, and reducing the effects of the self noise on the measured value using the correction value.

2. A measuring equipment automatic adjusting apparatus which corrects self-noise when amplifying an output signal from a sensor so as to conform to the sensitivity of the sensor, further processing the amplified signal, and then outputting the processed signal as a measured value, the apparatus being characterized by comprising sensor sensitivity adjusting means for adjusting an amplification factor so as to conform to the sensor sensitivity, self-noise value calculating means for calculating a self-noise component from the amplification factor adjusted by the sensor sensitivity adjusting means so as to conform to the sensor sensitivity, and measured value correcting means for calculating a true measured value from the self-noise component calculated by the self-noise value calculating means as well as the measured value containing the self-noise component.

3. A measuring equipment automatic adjusting method of adjusting an amplification factor of a signal processing circuit in which analog signals are simultaneously inputted to an amplifying circuit and an attenuating circuit and in which the amplified signal and the attenuated signal are then subjected to A/D conversion and synthesized with each other, the method being characterized by comprising, after generating a digital signal as a reference signal and subjecting this digital signal to D/A conversion, using said amplifying circuit to amplify the converted signal, subjecting the amplified signal to A/D conversion, then executing an arithmetic process on the converted signal to calculate a value, using said attenuating circuit to attenuate the signal, subjecting the attenuated signal to A/D conversion, then executing an arithmetic process on the converted signal to calculate a value, calculating an amplitude ratio of these values, comparing this amplitude ratio with an amplification ratio of said amplifying circuit to said attenuating circuit, calculating an adjustment amplification factor for the signal synthesis of the analog signal inputted to said amplifying circuit or said attenuating circuit, storing this adjustment amplification factor, and for actual signal processing, multiplying the amplification factor of said amplifying circuit or the attenuation factor of said attenuating circuit by said adjustment amplification factor.

4. A measuring equipment automatic adjusting apparatus which adjusts an amplification factor of a signal processing circuit in which analog signals are simultaneously inputted to an amplifying circuit and an attenuating circuit and in which the amplified signal and the attenuated signal are then subjected to A/D conversion and synthesized with each other, the apparatus being characterized by comprising signal generating means for generating a digital signal as a reference signal, a D/A converter which subjects the digital signal generated by the signal generating means to D/A conversion, an amplifying circuit which amplifies an output signal from the D/A converter, an attenuating circuit which attenuates the output signal from the D/A converter, a first A/D converter which subjects an output signal from the amplifying circuit to A/D conversion, a second A/D converter which subjects an output signal from the attenuating circuit to A/D conversion, arithmetic means for executing an arithmetic process on the output signals from the first A/D converter and second A/D converter, comparison means for calculating an amplitude ratio of a value based on the output signal from the first A/D converter to a value based on the output signal from tho second A/D converter, the values being calculated by the arithmetic means, to compare this amplitude ratio with an amplification ratio of the amplifying circuit to the attenuating circuit, amplification factor correcting means for calculating an adjustment amplification factor for the signal synthesis of the analog signal inputted to the amplifying circuit or attenuating circuit on the basis of a result of the comparison carried out by the comparison means, and memory means for storing the adjustment amplification factor calculated by the amplification factor correcting means, wherein for actual signal processing, the amplification factor of the amplifying circuit or the attenuation factor of the attenuating circuit is multiplied by the adjustment amplification factor.

5. A measuring equipment automatic adjusting method of adjusting an amplification factor of a signal processing circuit in which analog signals are simultaneously inputted to an amplifying circuit and an attenuating circuit and in which the amplified signal and the attenuated signal are then subjected to A/D conversion and synthesized with each other, the method being characterized by comprising generating a first digital signal as a first reference signal, subjecting this first digital signal to D/A conversion, using said amplifying circuit to amplify the converted signal, subjecting the amplified signal to A/D conversion, then executing an arithmetic process on the converted signal to calculate a value, generating a second digital signal as a second reference signal, subjecting this second digital signal to D/A conversion, using said attenuating circuit to attenuate the converted signal, subjecting the attenuated signal to A/D conversion, then executing an arithmetic process on the converted signal to calculate a value, comparing an amplitude ratio of these values obtained with an amplification ratio of said amplifying circuit to said attenuating circuit, calculating an adjustment amplification factor for the signal synthesis of the analog signal inputted to said amplifying circuit or said attenuating circuit, storing this adjustment amplification factor, and for actual signal processing, multiplying the amplification factor of said amplifying circuit or the attenuation factor of said attenuating circuit by said adjustment amplification factor.

6. A measuring equipment automatic adjusting apparatus which adjusts an amplification factor of a signal processing circuit in which analog signals are simultaneously inputted to an amplifying circuit and an attenuating circuit and in which the amplified signal and the attenuated signal are then subjected to A/D conversion and synthesized with each other, the apparatus being characterized by comprising signal generating means for generating a first and second digital signals as two types of reference signals, a D/A converter which subjects the first and second digital signals generated by the signal generating means to D/A conversion, an amplifying circuit which amplifies the first digital signal outputted by the D/A converter, an attenuating circuit which attenuates the second digital signal outputted by the D/A converter, a first A/D converter which subjects an output signal from the amplifying circuit to A/D conversion, a second A/D converter which subjects an output signal from the attenuating circuit to A/D conversion, arithmetic means for executing an arithmetic process on the output signals from the first A/D converter and second A/D converter, comparison means for calculating an amplitude ratio of a value based on the first digital signal to a value based on the second digital signal, the values being calculated by the arithmetic means, to compare this amplitude ratio with an amplification ratio of the amplifying circuit to the attenuating circuit, amplification factor correcting means for calculating an adjustment amplification factor for the signal synthesis of the analog signal inputted to the amplifying circuit or attenuating circuit on the basis of a result of the comparison carried out by the comparison means, and memory means for storing the adjustment amplification factor calculated by the amplification factor correcting means, wherein for actual signal processing, the amplification factor of the amplifying circuit or the attenuation factor of the attenuating circuit is multiplied by the adjustment amplification factor.

7. A measuring equipment automatic adjusting method of automatically adjusting an internal calibration signal which method adjusts a calibration signal contained in measuring equipment, the method being characterized by comprising generating a digital signal as an internal calibration signal, subjecting this digital signal to D/A conversion, amplifying the converted signal, subjecting the amplified signal to A/D conversion, then executing an arithmetic process on the converted signal to calculate an effective value, comparing the effective value with a predetermined calibration value to calculate an adjustment factor for the internal calibration signal, storing this adjustment factor, and for self-diagnosis for determining whether or not calibration has been actually completed, using a signal obtained by multiplying said digital signal by said adjustment factor.

8. A measuring equipment automatic adjusting apparatus for an internal calibration signal which apparatus adjusts a calibration signal contained in measuring equipment, the apparatus being characterized by comprising digital signal generating means for generating a digital signal as an internal calibration signal, a D/A converter which subjects the digital signal generated by the digital signal generating means to D/A conversion, effective-value calculating means for amplifying an output signal from the D/A converter, subjecting the amplified signal to A/D conversion, and then executing an arithmetic process on the converted signal, signal comparing means for comparing an effective value calculated by the effective-value calculating means, with a predetermined calibration value, factor calculating means for calculating an adjustment factor for the internal calibration signal on the basis of a result of the comparison carried out by the signal comparing means, and memory means for storing the adjustment factor calculated by the factor calculating means, wherein a signal obtained by multiplying said digital signal by said adjustment factor is used for self-diagnosis for determining whether or not calibration has been actually completed.

9. A measuring equipment automatic adjusting method including output voltage value adjusting method of executing signal processing on an input signal, subjecting the processed signal to D/A conversion, amplifying the converted signal, and outputting from an output terminal a voltage that is in a desired proportional relationship with said input signal, the output voltage value adjusting method being characterized by comprising calculating a correction factor using a reference voltage, an output terminal voltage for the reference voltage, and a desired output terminal voltage for the reference voltage, storing the correction factor, and for actual measurement, multiplying said input signal by said correction factor to calculate a correction value, subjecting this correction value to D/A conversion, amplifying the converted signal, and outputting the amplified signal to an output terminal.

10. A measuring equipment automatic adjusting method for measuring equipment characterized in that the automatic adjusting method for measuring equipment according to claim 9 is applied to an acoustic measuring instrument such as a sound level meter, a vibrometer, or a frequency analyzer.

11. A measuring equipment automatic adjusting apparatus including output voltage value adjusting apparatus which executes signal processing on an input signal, processing the resulting signal through a D/A converter and an amplifier to obtain a voltage that is in a desired proportional relationship with said input signal, and then outputting this voltage from an output terminal, the output voltage value adjusting apparatus being characterized by comprising reference voltage generating means for generating a reference voltage, an A/D converter which subjects to A/D conversion an output terminal voltage obtained from the reference voltage generated by the reference voltage generating means, adjustment value calculating means for calculating a correction factor using an output signal from the A/D converter, a desired output terminal voltage for the reference voltage, and the reference voltage, memory means for storing the correction factor calculated by the adjustment value calculating means, and signal processing means for reading the correction factor from the memory means and calculating a correction value from said input signal and said correction factor, wherein said correction value is outputted to the output terminal through said D/A converter and said amplifier.

12. A measuring equipment automatic adjusting apparatus for measuring equipment characterized in that the automatic adjusting apparatus for measuring equipment according to claim 11 is applied to an acoustic measuring instrument such as a sound level meter, a vibrometer, or a frequency analyzer.

13. A measuring equipment automatic adjusting method of automatically correcting an error in amplification factor for each range of a range switch for a measuring instrument, the method being characterized by comprising using a reference signal to calculate a correction amount from the error in amplification factor for each range of the range switch, storing the correction amount in a memory, reading from the memory a correction amount corresponding to a range of the range switch selected for actual measurement, and adding the correction amount to a measured value to obtain a final measured value.

14. The measuring equipment automatic adjusting method for measuring equipment according to claim 13, characterized in that said range switch is a level range switch and/or frequency characteristic switch provided in an acoustic measuring instrument such as a sound level meter, a vibrometer, or a frequency analyzer.

15. A measuring equipment automatic adjusting apparatus which automatically corrects an error in amplification radar for each range of a range switch for a measuring instrument, the apparatus being characterized by comprising reference signal oscillating means for generating a reference signal, correction amount calculating means for using the reference signal generated by the reference signal oscillating means to calculate a correction amount from the error in amplification factor for each range of the range switch, memory means for storing the correction amounts calculated by the correction amount calculating means so that the correction amounts correspond to the respective ranges, and correction processing means for reading from the memory means a correction amount corresponding to a range of the range switch selected for actual measurement and adding the correction amount to a measured value.

16. The measuring equipment automatic adjusting apparatus for measuring equipment according to claim 15, characterized in that said range switch is a level range switch and/or frequency characteristic switch provided in an acoustic measuring instrument such as a sound level meter, a vibrometer, or a frequency analyzer.

* * * * *

UNITED STATES PATENT AND TRADEMARK OFFICE
CERTIFICATE OF CORRECTION

PATENT NO.        : 6,931,341 B2
APPLICATION NO. : 10/450179
DATED             : August 16, 2005
INVENTOR(S)       : Wakabayashi et al.

It is certified that error appears in the above-identified patent and that said Letters Patent is hereby corrected as shown below:

Title Page Item (54),
Change "AUTOMATIC ADJUSTING METHOD FOR MEASURING EQUIPMENT AND APPARATUS USING THE SAME" to -- METHOD FOR AUTOMATICALLY ADJUSTING MEASURING EQUIPMENT AND DEVICE USING THE SAME --.

Column 1
Line 1 through 3, Change "AUTOMATIC ADJUSTING METHOD FOR MEASURING EQUIPMENT AND APPARATUS USING THE SAME" to --METHOD FOR AUTOMATICALLY ADJUSTING MEASURING EQUIPMENT AND DEVICE USING THE SAME --.

Column 12
Line 52, change "calculate the effective valve" to -- calculate the effective valve M1 --.
Line 54, change "analog signal by M1 the D/A converter"
          to -- analog signal by the D/A converter --.

Column 13
Line 13, change "factor a for the signal" to -- factor á for the signal --.
Line 18, change "the adjustment amplification factor a"
          to -- the adjustment amplification factor á --.

Column 20
Line 13, change "Furthermore, at step SP1" to -- Furthermore, at step SP11 --.

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 6,931,341 B2
APPLICATION NO. : 10/450179
DATED : August 16, 2005
INVENTOR(S) : Wakabayashi et al.

It is certified that error appears in the above-identified patent and that said Letters Patent is hereby corrected as shown below:

Title Page Item (54):
Change "AUTOMATIC ADJUSTING METHOD FOR MEASURING EQUIPMENT AND APPARATUS USING THE SAME" to -- METHOD FOR AUTOMATICALLY ADJUSTING MEASURING EQUIPMENT AND DEVICE USING THE SAME --.
In Section (56), "References Cited", further under "FOREIGN PATENT DOCUMENTS", change "WO   PCT/JP02/04912    5/2002" to -- WO 03/023328 6/2003 --. (That is, the reference to be listed is the international publication, not the international application.)
In Section (57), "ABSTRACT", 10th line, change "circuit 4 that" to -- circuit that --; 16th line, change "circuit 4 as well" to -- circuit as well --.

In the drawings:
FIG. 12, step box 51, change "generetor" to -- generator --.

Column 1:
Line 1 through 3, Change "AUTOMATIC ADJUSTING METHOD FOR MEASURING EQUIPMENT AND APPARATUS USING THE SAME" to -- METHOD FOR AUTOMATICALLY ADJUSTING MEASURING EQUIPMENT AND DEVICE USING THE SAME --.

Column 2:
Line 33, change "circuit 400-allows" to -- circuit 400 allows --.
Line 50, change "R2 the magnitudes" to -- R2, the magnitudes --; change "different and then" to -- different, and then --.

Column 4:
Line 18, change "self-noise which method" to -- self-noise, which method --.
Line 53, change "attenuating circuit and in" to -- attenuating circuit, and in --.

Column 5:
Line 11, change "circuit and in which" to -- circuit, and in which --.
Line 45, change "attenuating circuit and in" to -- attenuating circuit, and in --.

Column 6:
Line 5, change "circuit and in which" to -- circuit, and in which --.
Line 38, change "signal which method" to -- signal, which method --.
Line 53, change "signal which apparatus" to -- signal, which apparatus --.

UNITED STATES PATENT AND TRADEMARK OFFICE
CERTIFICATE OF CORRECTION

PATENT NO. : 6,931,341 B2
APPLICATION NO. : 10/450179
DATED : August 16, 2005
INVENTOR(S) : Wakabayashi et al.

It is certified that error appears in the above-identified patent and that said Letters Patent is hereby corrected as shown below:

Column 10:
Line 64, change "above, i.e. a method" to -- above, i.e., a method --.

Column 12:
Line 31, change "above, i.e. a" to -- above, i.e., a --.
Line 52, change "calculate the effective value" to -- calculate the effective value M1 --.
Line 54, change "analog signal by M1. the D/A converter"
 to -- analog signal by the D/A converter --.

Column 13:
Line 13, change "factor a for the signal" to -- factor $\alpha$ for the signal --.
Line 18, change "the adjustment amplification factor a"
 to -- the adjustment amplification factor $\alpha$ --.
Line 51, change "invention, i.e. another" to -- invention, i.e., another --.

Column 15:
Line 10, change "invention, i.e. the" to -- invention, i.e., the --.
Line 46, change "the A/ID converter" to -- the A/D converter --.

Column 16:
Line 10, change "invention, i.e. a method" to -- invention, i.e., a method --.

Column 17:
Line 37, change "signal x so that $\alpha x + \beta$" to -- signal x to $\alpha x + \beta$ --.

Column 19:
Line 47, change "above, i.e. a" to -- above, i.e., a --.

Column 20:
Line 13, change "Furthermore, at step SP1" to -- Furthermore, at step SP11 --.

Column 21:
Line 37, change "invention the effects" to -- invention, the effects --.

Column 22:
Line 62, change "the Present" to -- the present --.

UNITED STATES PATENT AND TRADEMARK OFFICE
CERTIFICATE OF CORRECTION

PATENT NO. : 6,931,341 B2
APPLICATION NO. : 10/450179
DATED : August 16, 2005
INVENTOR(S) : Wakabayashi et al.

It is certified that error appears in the above-identified patent and that said Letters Patent is hereby corrected as shown below:

<u>Column 23</u>:
Line 15, change "the self noise" to -- the self-noise --.

<u>Column 24</u>:
Line 11, change "from tho second" to -- from the second --.

<u>Column 26</u>:
Line 57, change "amplification radar" to -- amplification factor --.

This certificate supersedes the Certificate of Correction issued July 22, 2008.

Signed and Sealed this

Sixteenth Day of June, 2009

JOHN DOLL
*Acting Director of the United States Patent and Trademark Office*